United States Patent [19]
Mizuno et al.

[11] Patent Number: 5,986,292
[45] Date of Patent: Nov. 16, 1999

[54] SEMICONDUCTOR INTEGRATED LOGIC CIRCUIT DEVICE

[75] Inventors: Hiroshi Mizuno; Youichirou Mae; Hidenori Shibata; Kazuo Tsuzuki, all of Osaka, Japan

[73] Assignee: Matsushita Electric Industrial Co., Ltd., Osaka, Japan

[21] Appl. No.: 08/997,944

[22] Filed: Dec. 24, 1997

[30] Foreign Application Priority Data

Dec. 27, 1996 [JP] Japan ................................. 8-350491

[51] Int. Cl.⁶ ........................................................ H01L 27/10
[52] U.S. Cl. ..................... 257/202; 257/204; 257/206; 257/369; 257/401
[58] Field of Search ................................. 257/202, 204, 257/206, 369, 401

[56] References Cited

U.S. PATENT DOCUMENTS

| | | | |
|---|---|---|---|
| 4,626,880 | 12/1986 | Nguyen Minh et al. | 357/23.4 |
| 4,959,698 | 9/1990 | Shinichi | 357/23.6 |
| 5,355,008 | 10/1994 | Moyer et al. | 257/341 |
| 5,444,275 | 8/1995 | Kugishima et al. | 257/206 |
| 5,517,041 | 5/1996 | Torii et al. | 257/206 |
| 5,539,246 | 7/1996 | Kapoor | 257/618 |
| 5,654,563 | 8/1997 | Rostoker et al. | 257/206 |
| 5,838,050 | 11/1998 | Ker et al. | 257/401 |
| 5,852,315 | 12/1998 | Ker et al. | 257/355 |

FOREIGN PATENT DOCUMENTS

| | | |
|---|---|---|
| 61-080859 | 4/1986 | Japan . |
| 03230563 | 10/1991 | Japan . |
| 05074935 | 3/1993 | Japan . |

*Primary Examiner*—William Mintel
*Attorney, Agent, or Firm*—McDermott, Will & Emery

[57] ABSTRACT

An inverter-type basic cell, with a hexagonal contour, comprises one CMOS device pair arrangement including an n-channel transistor and a p-channel transistor. The inverter-type basic cell has a gate region annularly formed and connected in parallel with the n-channel and p-channel transistors, a sectoral drain diffusion region having a vertex at the center of the annularly-formed gate region, and a source diffusion region that is formed outside of the gate region in such a way as to define a shape having two opposing sides that lie on the prolongation of the two radii of the sectoral drain diffusion region.

14 Claims, 21 Drawing Sheets

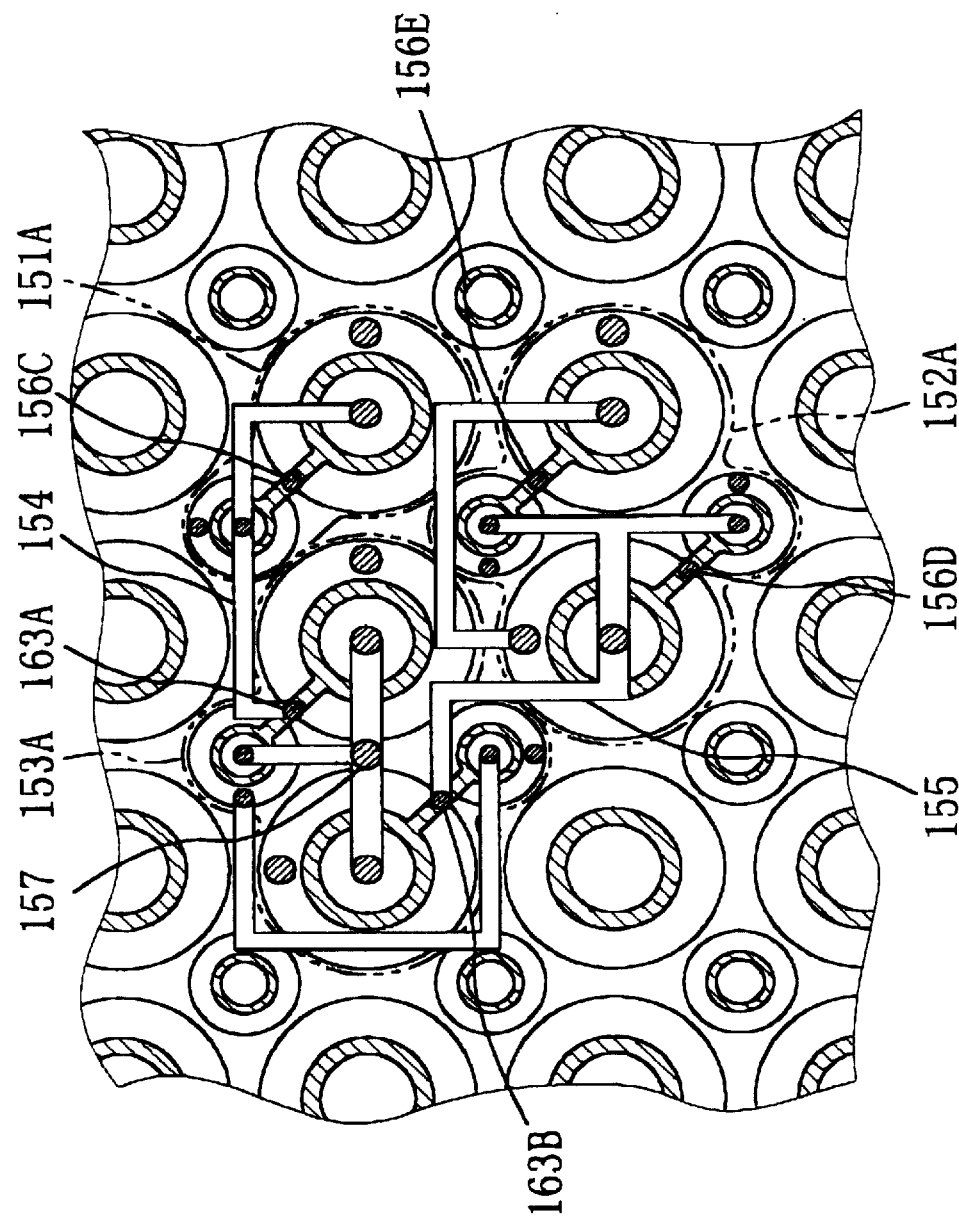

SEMICONDUCTOR INTEGRATED LOGIC CIRCUIT DEVICE

BACKGROUND OF THE INVENTION

This invention generally relates to semiconductor integrated circuit (SIC) devices that make use of logic elements formed of CMOS devices. More specifically, the present invention pertains to a SIC device with a desirable form achieved by controlling, even when light refractlon/ interference in lithography processing or "grounding" in etching processing occurs due to the advance of miniaturization in the LSI fabrication, the effect of such occurrence.

Several ways of implementing a CMOS logic section for semiconductor integrated circuits, such as gate array architecture, standard cell architecture, and custom layout architecture, have been known in the art (see "*The Design of ULSIs*," published by Kikaku Center and "*The Design of CMOS ULSIs*," published by Baifu-Kan). A conventional CMOS logic section is provided with a desirable logic circuit as follows. According to a logic circuit to be implemented, n-channel and p-channel transistors, which each have a rectangular source diffusion region, gate region, and drain diffusion region, are laid out and interconnections are provided by forming polysilicon layers and interconnection layers (metal layers), to implement a target logic circuit, SIC devices are completed by the following steps: (i) the design step for producing a mask pattern by carrying out, based on the specifications of a target SIC device, functional design, logic design, and mask design, (ii) the mask production step for producing a photomask from the mask pattern prepared in the design step, (iii) the LSI fabrication step for forming, by making utilization of the photo mask prepared in the mask production step, circuitry on a silicon substrate by means of oxidation, diffusion, lithography, etching, CVD, sputtering, and so on, (iv) the assembly step for carrying out packaging, and (v) the inspection step for testing whether SIC devices completed are functioning correctly.

For the case of SIC devices employing therein a conventional CMOS logic section, mask patterns, prepared in the design step for transistors formed of a rectangular source diffusion region, gate region, and drain diffusion region, are classified to mask layers required in the LSI fabrication step and thereafter are converted into patterns of rectangles on a photomask. The photomask thus created is used to fabricate a target SIC device.

With the advance of miniaturization, in the LSI fabrication of SIC device circuits of the deep sub-micron generation in which the gate length is 0.25 µm or less, due to light interference or proximity effect in the lithography process and due to the mask form dependency in the etching process, there may be produced a considerable difference in form between a mask pattern prepared in the design step and a form produced on a post-LSI fabrication SIC device. The resulting SIC device is therefore problematic, in other words it may suffer electrical characteristic problems and will not operate correctly.

To cope with such a problem, in the development of LSI fabrication after the deep sub-micron generation, a plurality of mask patterns of various forms different from the form of a target SIC device, are prepared. Such mask patterns are experimentally produced in an LSI fabrication step or subjected to photolithography simulation carried out by computer, in order to obtain a mask pattern form capable of implementing a SIC device with a form most similar to the target form. In the mask production step, based on characteristics obtained from the mask pattern form, special mask correcting processes, such as the adjustment of linewidth and the addition of smaller rectangles to vertices of each rectangle, are performed on a mask pattern portion at which the foregoing effects such as the interference of light are expected to take place. For the proximity effect, a phase shift technique has been proposed wherein the polarizing directions of adjacent mask patterns are arranged in such a way as to cross at right angles. Photolithography technologies for use in post-deep sub-micron generation LSI fabrication are shown by T. Takigawa and others, "*ULSI Lithography Technology Innovaton*," published by Science Forum.

However, SIC devices according to conventional technology suffer various problems. Since conventional SIC devices are fabricated by combinations of rectangular figures of various sizes and by means of mask patterns, the effect of lithography and etching processing due to miniaturization is very complicated. For this reason, it is hard in the LSI fabrication to experimentally produce a mask pattern capable of producing a desirable semiconductor integrated circuit device form. The foregoing simulation may be completed in a realistic period of time when only several transistors are involved; however, it is very difficult to estimate and find all possible patterns for a SIC device fabricated by integration of several millions of transistors in various forms.

In the phase shift technology, it is required to perform allocation of phases orthogonal to mask patterns adjacent to each other. Since conventional SIC devices are designed using rectangular figures of various forms, this is a bar to suitably allocating phases.

SUMMARY OF THE INVENTION

Bearing in mind the above-noted problems with prior art techniques, the Present invention was made. Accordingly, a general object of the present invention is to control undesirable effects taking place in the LSI fabrication, such as light interference and proximity effect in lithography processing and effects due to the mask pattern form dependency in etching processing while at the same time easily estimating in advance these effects so as to produce a mask pattern capable of controlling the effects in the design step.

In order to achieve the object, it is arranged in the present invention such that a basic cell that is comprised of CMOS devices or a basic cell that is comprised of n-type or p-type MOS transistors has, as its external contour in plane, a hexagonal or more sided polygonal shape or a circular shape.

The present invention provides a first semiconductor integrated circuit device comprising:
 (a) a logic circuit section that is formed on a surface of a semiconductor substrate;
 (b) a large number of basic cells that are formed in said logic circuit section;
 wherein:
  each such basic cell includes at least one transistor pair arrangement composed of an n-channel transistor and a p-channel transistor, said n-channel and p-channel transistors having gate regions that are electrically connected together;
  each such basic cell is formed in an element formation surface in parallel with said semiconductor substrate surface, defining, as an external contour thereof, a six or more sided polygonal shape or a circular shape.

It is to be noted that, in the present invention, by a polygonal form including a rectangle is meant a polygon including a regular polygonal form and a polygonal form with somewhat round vertices while, on the other hand, by a circular form is meant a complete round, an approximately complete round, or an oval.

In accordance with the first semiconductor integrated circuit device, the plane external contour of basic cells is either a hexagonal or more sided polygonal form or a circular form and the shape of mask patterns for forming, for example, internal transistors is likewise formed of combinations of hexagonal or more sided polygonal forms or circular forms. This prevents useless empty regions from being created. As a result of such arrangement, even when rounding has effect on the form of a mask pattern in lithography and etching processing of the LSI fabrication, the difference in form between that mask pattern and the original mask pattern may be controlled easily in the case of the polygonal and circular forms. Additionally, it becomes easy to find a mask pattern with a desirable form. As a result, even when the miniaturization of layout patterns further advances, a semiconductor integrated circuit device having a target form may be implemented.

In the first semiconductor integrated circuit device, it is preferred that, in each of said basic cells, said p-channel transistor has a total gate width greater than that of said n-channel transistor As a result of such arrangement, even when the p-channel transistor is inferior in electrical characteristic to the n-channel transistor, it is possible to allow the electrical characteristic of the p-channel transistor and that of the n-channel transistor to agree with each other, thereby ensuring that logic circuit sections made up of CMOS devices are positively formed.

In the first semiconductor integrated circuit device, it is preferred that, in each basic cell, said p-channel transistor has, at said element formation surface, an external contour larger than that of said n-channel transistor. As a result of such arrangement, even when the p-channel transistor is inferior in electrical characteristic to the n-channel transistor, it is possible to allow the electrical characteristic of the p-channel transistor and that of the n-channel transistor to agree with each other, thereby ensuring that logic circuit sections made up of CMOS devices are positively formed.

In the first semiconductor integrated circuit device. it is preferred that:
 (a) both said gate regions of said n-channel and p-channel transistors are annularly formed in said element formation surface;
 (b) said n-channel transistor includes:
   a first source/drain diffusion region that is formed inside said annularly-formed gate region of said n-channel transistor, said first source/drain diffusion region defining a sectoral shape having a vertex at the center of said annularly-formed gate region of said n-channel transistor;
   a second source/drain diffusion region that is formed outside said annularly-formed gate region of said n-channel transistor, said second source/drain diffusion region defining a shape having two opposing sides that lie on the prolongation of the two radii of said sectoral first source/drain diffusion region; and
 (c) said p-channel transistor includes;
   a third source/drain diffusion region that is formed inside said annularly-formed gate region of said p-channel transistor, said third source/drain diffusion region defining a sectoral shape having a vertex at the center of said annularly-formed gate region of said p-channel transistor without overlapping said first source/drain diffusion region of said n-channel transistor;
   a fourth source/drain diffusion region that is formed outside said annularly-formed gate region of said p-channel transistor, said fourth source/drain diffusion region defining a shape having two opposing sides that lie on the prolongation of the two radii of said sectoral third source/drain diffusion region.

As a result of such arrangement, the basic cell becomes a CMOS device. This makes it possible to positively form a logic circuit section. Each transistor is provided with an annularly-formed gate region, which produces the advantage that higher-level integration can be accomplished because the present invention eliminates the need for allowing a margin for coping with the tapering of gate electrode ends; however, such a margin must be taken into consideration in conventional linear gate electrode mask patterns.

In the first semiconductor integrated circuit device, it is preferred that:
 (a) said gate regions are formed of a first gate electrode portion for said n-channel transistor that is annularly formed in said element formation surface and a second gate electrode portion for said p-channel transistor that is formed in such a way as to enclose the outside of said annularly-formed first gate electrode portion, respectively;
 (b) said n-channel transistor includes:
   a first source/drain diffusion region that is formed inside said annularly-formed first gate electrode portion;
   a second source/drain diffusion region that is formed outside and along said annularly-formed first electrode portion;
 (c) said p-channel transistor includes:
   a third source/drain diffusion region that is formed inside and along said second gate electrode portion without overlapping said second source/drain diffusion region of said n-channel transistor;
   a fourth source/drain diffusion region that is formed outside and along said second gate electrode portion.

As a result of such arrangement, the basic cell becomes a CMOS device. This makes it possible to positively form a logic circuit section.

In the first semiconductor integrated circuit device, it is preferred that said basic cells are arranged at predetermined intervals in a matrix of rows and columns. As a result of such arrangement, inter-cell effects in the LSI fabrication can be found experimentally or can be found by performing the simulation of a photolithography process. Even when the miniaturization of layout patterns further advances, it is possible to improve on the productivity.

In the first semiconductor integrated circuit device, it is preferred that basic cells of said basic cells that belong in one row are shifted rowwise by half of said predetermined interval with respect to basic cells that belong in a row adjacent to said one row. As a result of such arrangement, the basic cells are arranged such that they are packed in closest fashion in 2D, thereby making it possible to more densely lay out basic cells.

The present invention provides a second semiconductor integrated circuit device comprising a logic circuit section that is formed on a surface of a semiconductor substrate,
 said logic circuit section having:
  (a) a great number of n-type basic cells which each include an n-channel transistor, said n-channel transistor comprising:
   (a-1) a gate region that is annularly formed in an element formation surface in parallel with said semiconductor substrate surface;

(a-2) a first source/drain diffusion region that is formed inside said gate region;

(a-3) a second source/drain diffusion region that is formed outside and along said gate region; and (b) a great number of p-type basic cells which each have a p-channel transistor, said p-channel transistor comprising:

(b-1) a gate region that is annularly formed in said element formation surface;

(b-2) a first source/drain diffusion region that is formed inside said gate region;

(b-3) a second source/drain diffusion region that is formed outside and along said gate region;

wherein said second source/drain diffusion regions of said n-channel and p-channel transistors each have, at said element formation surface, either a hexagonal or more sided polygonal external contour or a circular external contour.

In accordance with the second semiconductor integrated circuit device, the basic cell is formed of one n-channel transistor or one p-channel transistor, each transistor's gate region is annularly formed, and either one of the second and fourth source/drain diffusion regions that are formed outside the gate regions has a hexagonal or more sided polygonal form or a circular form, whereby mask patterns in the LSI fabrication are unlikely to be influenced by rounding. Additionally, experimentally finding rounding effects on several basic cells or computing rounding effects on several basic cells by simulation makes it possible to easily find rounding effects on a large-scale integrated circuit by regarding it as a succession of rows of several basic cells. As a result, even when the miniaturization of layout patterns further advances, it is possible to obtain a semiconductor integrated circuit with a desirable form. The gate region is formed annularly, which produces the advantage that higher-level integration can be accomplished because the present invention eliminates the need for allowing a margin for coping with the tapering of gate electrode ends. Such a margin must be taken into consideration in conventional linear gate electrode mask patterns.

In the second semiconductor integrated circuit device, it is preferred that said n-type and p-type basic cells have, as external contour, identical rectangular, hexagonal, or circular forms of the same size. This reduces the effect of rounding by mask patterns in the LSI fabrication to a further extent.

In the second semiconductor integrated circuit device, it is preferred that said logic circuit section has a logic unit made up of at least one said n-type basic cell and at least one said p-type basic cell, and that said n-type and p-type basic cells of said logic unit are located next to each other and have respective gate regions that are electrically connected together. A CMOS device, as a logic unit, is constructed by combining basic cells, which makes it possible to positively form a logic circuit section. Additionally, even when there is a difference in electrical characteristic between n-channel transistor and p-channel transistor, such a difference can be canceled by suitably combining n-type basic cells with p-type basic cells.

In the second semiconductor integrated circuit device, it is preferred that said n-type and p-type basic cells are arranged by type at predetermined intervals in a matrix of rows and columns in order that basic cells of the same type may be arranged in the row direction or in the column direction. Since series of n-channel and p-channel transistors are linearly arranged, series of p-well formation regions and n-well formation regions are likewise linearly arranged, thereby relaxing spacing rules between wells and reducing overhead with substrate contacts. The level of integration is further improved.

In the second semiconductor integrated circuit device, it is preferred that basic cells of said basic cells that belong in one row are shifted rowwise by half of said predetermined interval with respect to basic cells that belong in a row adjacent to said one row. As a result of such arrangement, the basic cells are arranged such that they are packed in closest fashion in 2D, thereby making it possible to more densely lay out basic cells.

In the second semiconductor integrated circuit device, it is preferred that said p-channel transistor of said p-type basic cell has a gate width greater than that of said n-channel transistor of said n-type basic cell, and that said p-type basic cell has, at said element formation surface, an external contour larger in size than that of said n-type basic cell. As a result of such arrangement, even when the p-channel transistor is inferior in electrical characteristic to the n-channel transistor, it is possible to allow the electrical characteristic of the p-channel transistor and that of the n-channel transistor to agree with each other.

BRIEF DESCRIPTION OF THE DRAWINGS

FIG. 22 is a plane view of a post-LSI fabrication SIC device produced from mask layout diagrams of logic cells according to the fifth embodiment of the present invention.

DETAILED DESCRIPTION OF THE INVENTION

First Embodiment

A first embodiment of the present invention is now described below.

Figure 1A:
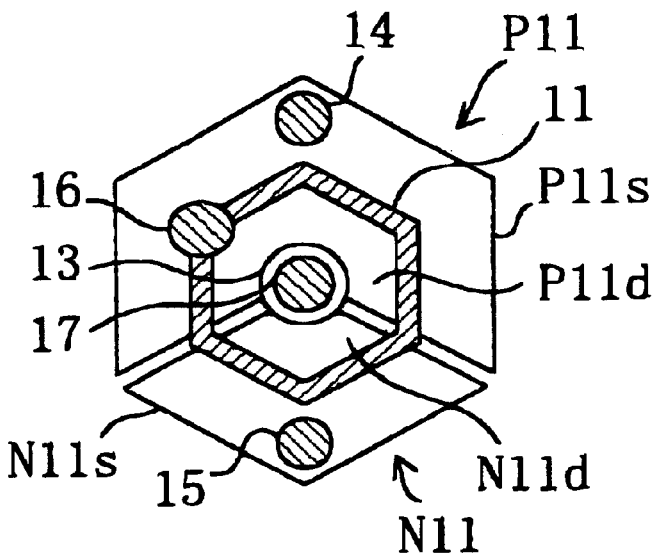
FIGS. 1(a) through 1(c) illustrate in plane mask layouts of basic cells of different types in a SIC device of the standard cell architecture in accordance with the first embodiment of the present invention.
Figure 1B:
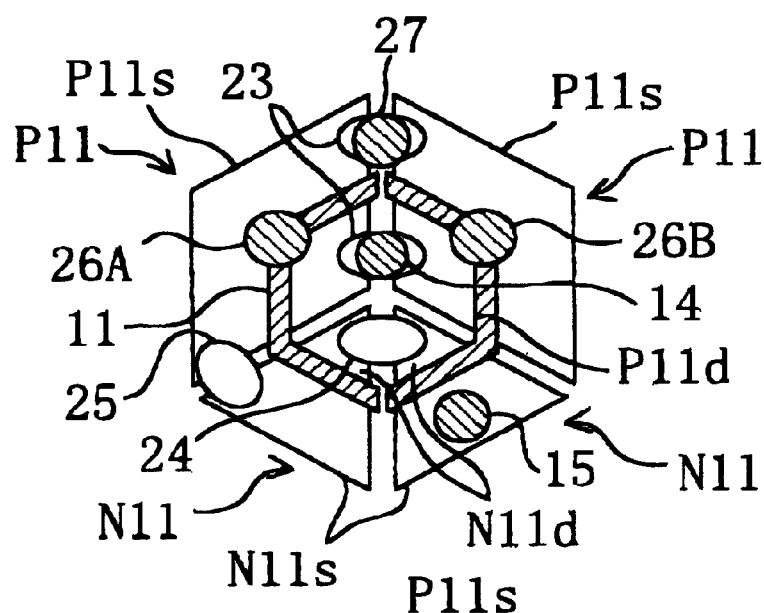
Figure 1C:
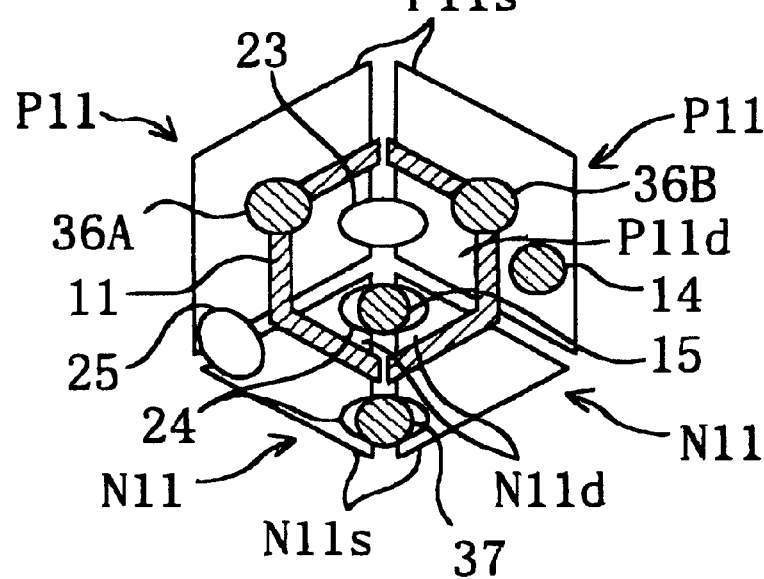

Reference is made to FIGS. 1(a) through 1(c) wherein there are shown mask layouts of basic cells of different types in a SIC device of the standard cell architecture in accordance with the first embodiment of the present invention. Standard cell architecture basic cells correspond to logic cells each having a logic function. FIG. 1(a) is an illustration of a mask layout of an inverter-type basic cell (an inverter logic element). FIG. 1(b) is an illustration of a mask layout of a NAND-type basic cell (a NAND logic element). FIG. 1(c) is an illustration of a mask layout of a NOR-type basic cell (a NOR logic element).

The inverter-type basic cell, shown in the FIG. 1(a) mask layout, includes one pair arrangement of CMOS devices, the arrangement being made up of an n-channel transistor N11 and a p-channel transistor P11. The external contour of the inverter-type basic cell is hexagonal. Referring to FIG. 1(a), element 11 is a gate region that is annularly formed and connected to the transistors N11 and P11. N11d of the n-channel transistor N11 is a drain diffusion region serving as a first source/drain diffusion region. The drain diffusion region N11d is formed inside the gate region 11 wherein the drain diffusion region N11d defines a nearly sectoral region. in other words the drain diffusion region N11d is a sector of the gate region 11 having a central angle of less than 180 degrees. N11s of the n-channel transistor N11 is a source diffusion region serving as a second source/drain diffusion region. The source diffusion region N11s is formed outside the gate region 11 in the direction in which the drain diffusion region N11d extends beyond the gate region 11. Referring still to FIG. 1(a), P11d of the p-channel transistor P11 is a drain diffusion region serving as a third source/drain diffusion region. The drain diffusion region P11d is formed inside the gate region 11 wherein the drain diffusion region P11d defines a nearly sectoral region without any overlap with the drain diffusion region N11d, in other words the drain diffusion region P11d is another sector of the gate region 11 having a central angle of 180 degrees or more. P11s of the p-channel transistor P11 is a source diffusion region serving as a fourth source/drain diffusion region. The source diffusion region P11s is formed outside the gate region 11 in the direction in which the drain diffusion region P11d extends beyond the gate region 11. Element 13 is a metal layer that is used to provide connection between the drain diffusion region N11d of the n-channel transistor N11 and the drain diffusion region P11d of the p-channel transistor P11. Element 14 is a contact that is used to provide connection between the drain diffusion region P11d or source diffusion region P11s of the p-channel transistor P11 and a power line. Element 15 is a contact that is used to provide connection between the drain diffusion region N11d or source diffusion region N11s of the n-channel transistor N11 and a ground line. Element 16 is an input terminal of the inverter-type basic cell, serving also as a contact that is used to provide connection between signal lines and the gate regions 11 of the transistors N11 and P11. Element 17 is an output terminal of the inverter type basic cell, serving also as a contact that is used to provide connection between signal lines and the drain diffusion regions N11d and P11d of the transistors N11 and P11.

The NAND-type basic cell, shown in the FIG. 1(b) mask layout, includes two pair arrangements of CMOS devices, each of the CMOS pair arraignments being made up of an n-channel transistor N11 and a p-channel transistor P11. The external contour of the NAND-type basic cell is hexagonal. In FIGS. 1(a) and 1(b), the same reference numerals have been applied to like structural elements, and the already-described elements are not discussed here. Element 23 is a metal layer that is used to provide connection between the drain diffusion regions P11d or between the source diffusion regions P11s of the p-channel transistors P11. Element 24 is a metal layer that is used to provide connection between the drain diffusion regions N11d of the n-channel transistors N11. Element 25 is a metal layer that is used to provide connection between the source diffusion region P11s of the p-channel transistor P11 and the source diffusion region N11s of the n-channel transistor N11. Element 26A and 26B are input terminals of the NAND-type basic cell, serving also as contacts that are used to provide connection between signal lines and the gate regions 11 of the transistors N11 and P11. Element 27 is an output terminal of the NAND-type basic cell, serving also as a contact that is used to provide connection between a signal line and the source diffusion region P11s of the p-channel transistor P11.

The NOR-type basic cell, shown in the FIG. 1(c) mask layout, includes two pair arrangements of CMOS devices, each of the CMOS pair arrangements being made up of an n-channel transistor N11 and an p-channel transistors P11. The external contour of the NOR-type basic cell is hexagonal. In FIGS. 1(b) and 1(c), the same reference numerals have been applied to like structural elements, and the already-described elements are not discussed here. 36A and 36B are input terminals of the NOR-type basic cell, serving also as contacts that are used to provide connection between signal lines and the gate regions 11 of the transistors N11 and P11. Element 37 is an output terminal of the NOR-type basic cell, serving also as a contact that is used to provide connection between a signal line and the source diffusion region N11s of the n-channel transistor N11.

Figure 2A:
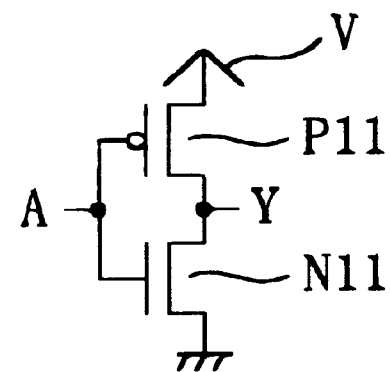
FIGS. 2(a) through 2(c) are circuit diagrams at netlist level corresponding to basic cells of the first and second embodiments of the present invention.
Figure 2B:
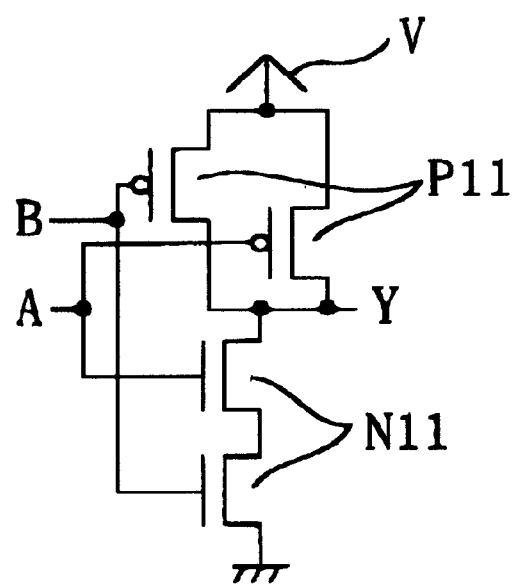
Figure 2C:
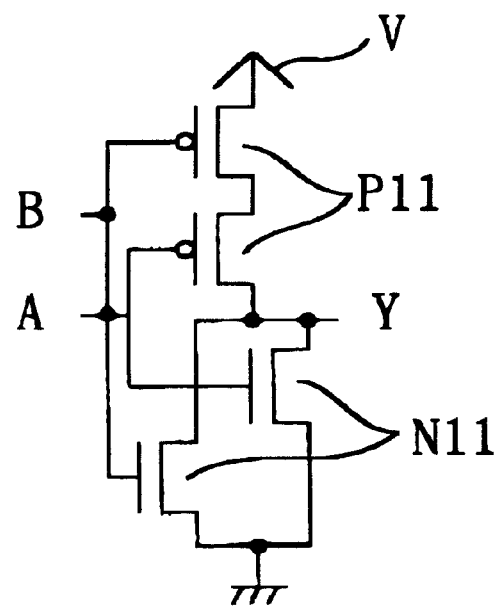

FIG. 2(a) is a circuit diagram for the FIG. 1(a) basic cell. FIG. 2(b) is a circuit diagram for the FIG. 1(b) basic cell. FIG. 2(c) is a circuit diagram for the FIG. 1(c) basic cell. The inverter circuit diagram, shown in FIG. 2(a), corresponds to the FIG. 1(a) mask layout diagram. The NAND circuit diagram. shown in the FIG. 2(b), corresponds to the FIG. 1(b) mask layout diagram. The NOR circuit diagram, shown in the FIG. 2(c), corresponds to the FIG. 1(c) mask layout diagram. Referring to the FIG. 2(a) inverter circuit diagram, the p-channel transistor P11 has a source electrode connected to a supply voltage V, a gate electrode connected to an input terminal A, and a drain electrode connected to an output terminal Y. The n-channel transistor N11 has a source electrode connected to ground, a gate electrode in common use with the p-channel transistor P11 connected to the input terminal A, and a drain electrode in common use with the p-channel transistor P11 connected to the output terminal Y. Whereas the input terminal A corresponds to the input terminal 16 of FIG. 1(a), the output terminal Y corresponds to the output terminal 17 of FIG. 1(a). The inverter circuit is a circuit which takes in data applied at the input terminal A and puts out the data having an opposite value to the original input data at the output terminal Y.

As shown in the FIG. 2(b) NAND circuit diagram, the two p-channel transistors P11 are connected in parallel, wherein both the source electrodes are connected to the supply voltage V, both the drain electrodes are connected to the output terminal Y, and one of the gate electrodes is connected to the input terminal A while the other is connected to the input terminal B. On the other hand, the two n-channel transistors N11 are connected to each other in series The source electrode of one of the two n-channel transistors N11 is connected to the drain electrode of the other n-channel transistor N11, the gate electrode in common use with, that is, shared with one of the two p-channel transistors P11 is connected to the input terminal A, and the drain electrode in common use with each of the p-channel transistors P11 is connected to the output terminal Y. The source electrode of the other n-channel transistor N11 is connected to ground and the gate electrode in common use with the other p-channel transistor P11 is connected to the input terminal B. Whereas the input terminals A and B correspond to the input terminals 26A and 26B of FIG. 1(b), respectively. the output terminal Y corresponds to the output terminal 27 of FIG. 1(b). The NAND circuit is a circuit whose output data provided at the output terminal Y is low if all of its input data applied at the input terminals A and B are high. If the NAND circuit inputs any other input data combination, then its output data is high, In contrast with the NAND circuit of FIG. 2(b), in the NOR circuit of FIG. 2(c) the two p-channel transistors P11 are connected in series and the two n-channel transistors N11 are connected in parallel. The input terminals A and B correspond to the input terminals 36A and 36B of FIG. 1(c), respectively. The output terminal Y corresponds to the output terminal 37 of FIG. 1(c). The NOR circuit is a circuit whose output data provided at the output terminal Y is high if all of its input data applied at the input terminals A and B is low. If the NOR circuit inputs any other input data combination, then its output data is low.

Figure 3A:
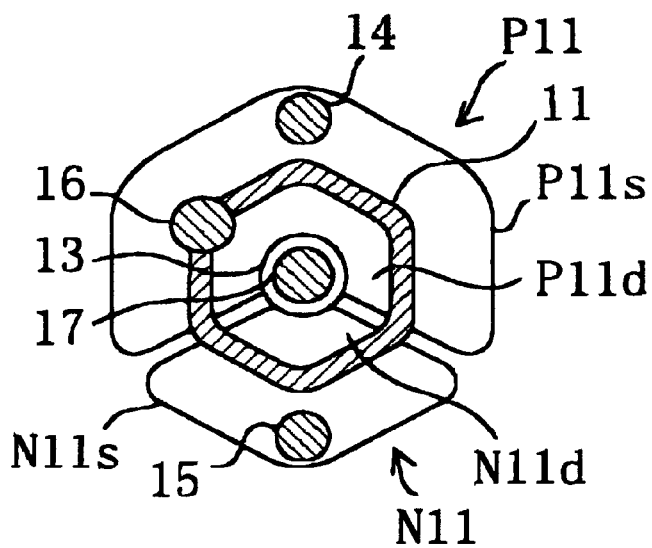
FIGS. 3(a) through 3(c) illustrate in plane a SIC device after an LSI fabrication step produced from mask layout diagrams of basic cells in accordance with the first embodiment of the present invention.
Figure 3B:
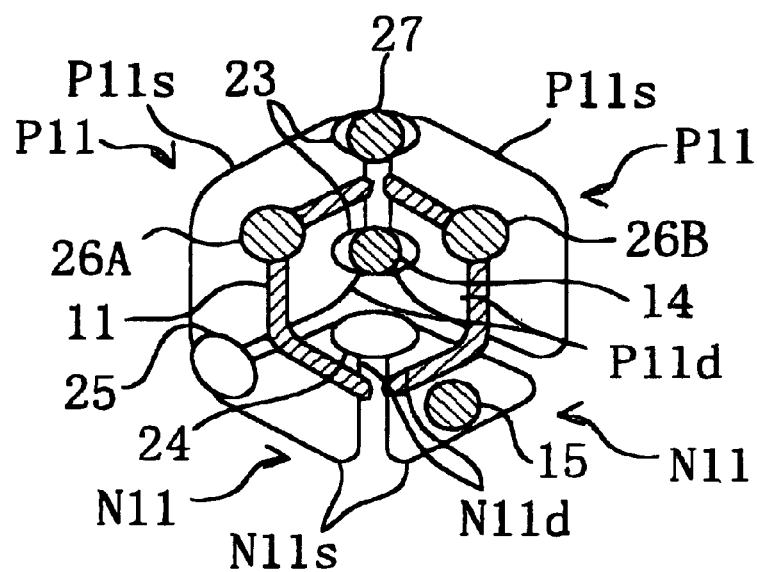
Figure 3C:
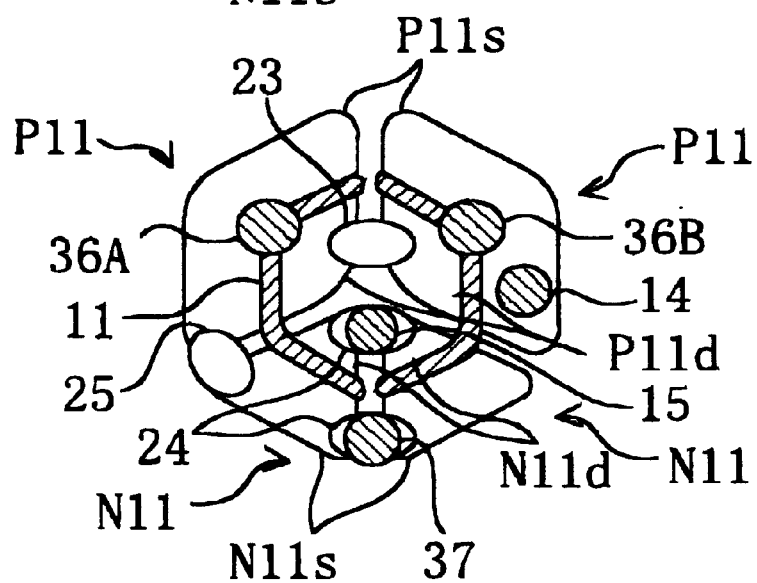

FIGS. 3(a) through 3(c) illustrate in plane a post-LSI fabrication SIC device produced from the basic cell mask layout diagrams of FIGS. 1(a) through 1(c). FIG. 3(a) is an illustration of an inverter-type basic cell. FIG. 3(b) is an illustration of a NAND-type basic cell. FIG. 3(c) is an illustration of a NOR-type basic cell. In FIGS. 1 and 3, the same reference numerals have been applied to like structural elements, and the already-described elements are not discussed here.

Figure 4:
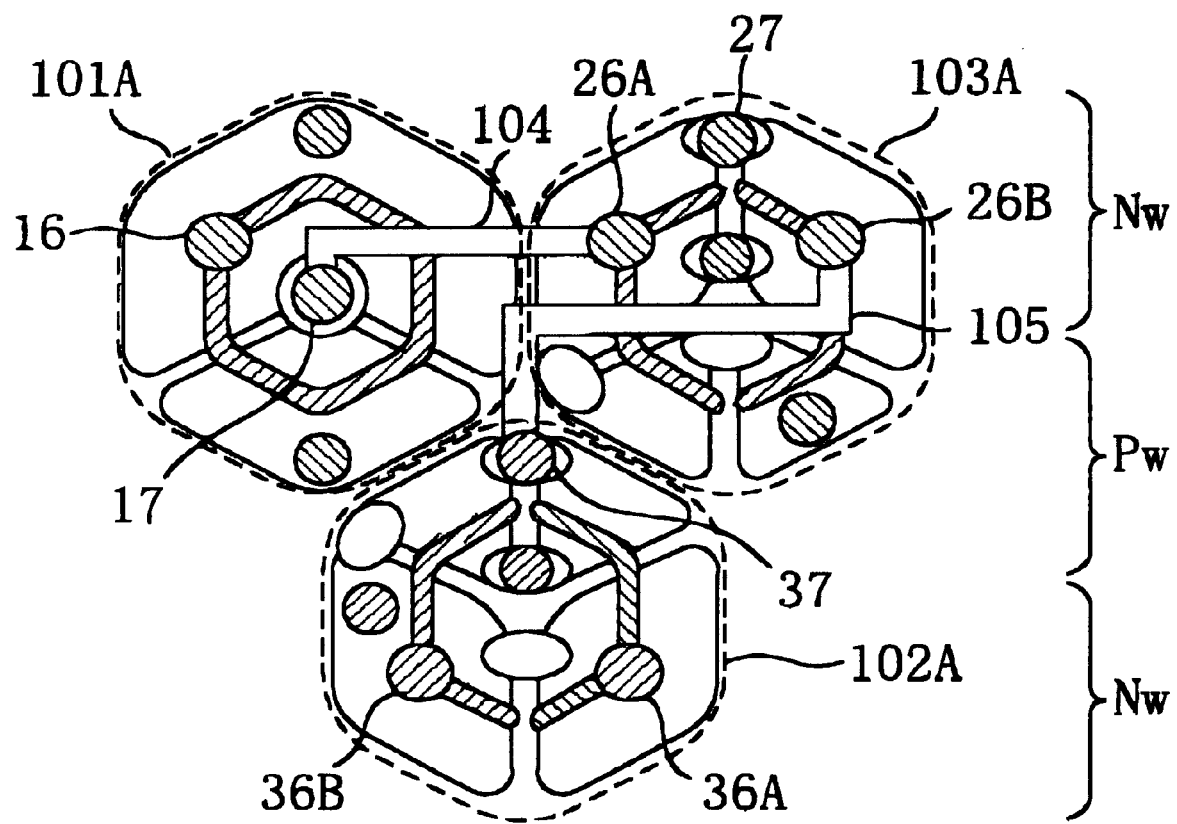
FIG. 4 depicts in plane a portion of a SIC device after an LSI fabrication step in a logic circuit produced from basic cells of the first embodiment of the present invention.

FIG. 4 illustrates in plane a portion of a post-LSI fabrication SIC device in a logic circuit produced from basic cells having the mask layouts shown in FIGS. 1(a) through 1(c). Element 101A is an inverter-type basic cell. Element 102A is a NOR-type basic cell. Element 103A is a NAND-type basic cell. Element 104 is a signal line formed of a metal layer that is used to provide connection between an output terminal 17 of the inverter-type basic cell 101A and an input terminal 26A of the NAND-type basic cell 103A. Element 105 is a signal line formed of a metal layer that is used to provide connection between an output terminal 37 of the NOR-type basic cell 102A and an input terminal 26B of the NAND-type basic cell 103A. The logic circuit has input terminals 16, 36A, 36B and an output terminal 27.

Figure 5:
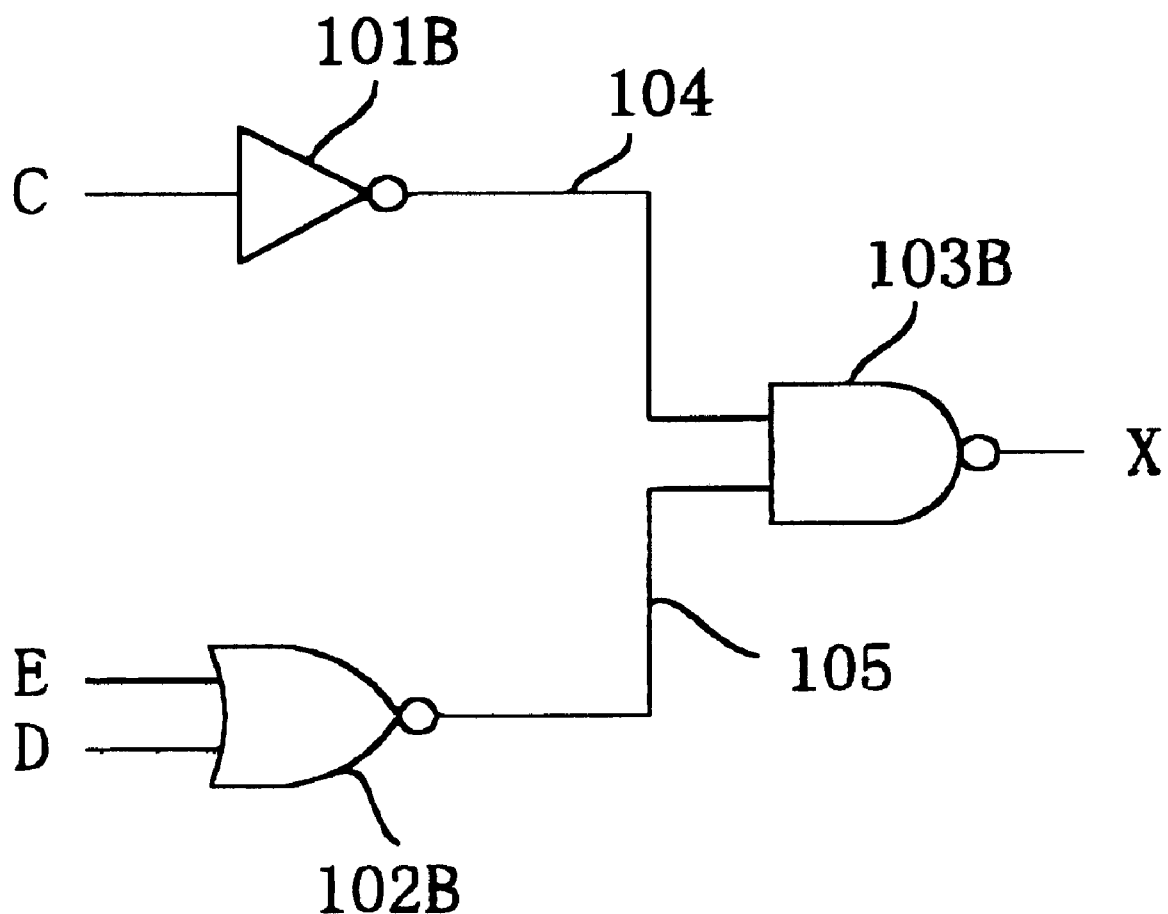
FIG. 5 is a circuit diagram illustrating a portion of a logic circuit produced from basic cells in accordance with the first and second embodiments and the fourth and fifth embodiments of the present invention.

FIG. 5 is a logic circuit diagram corresponding to the fragmentary plan view of the FIG. 4 SIC device. Element 101B is an inverter logic element. Element 102B is a NOR logic element. Element 103B is a NAND logic element. The output of the inverter logic element 101B is coupled, via the signal line 104, to one of the two input terminals of the NAND logic element 103B. The output of the NOR logic element 102B is coupled, via the signal line 105, to the other input terminal of the NAND logic element 103B. The inverter logic element 101B has an input terminal C which corresponds to the input terminal 16 of the inverter-type basic cell 101A. The NOR logic element 102B has input terminals D and E which correspond to the input terminals 36A and 36B of the NOR-type basic cell 102A of FIG. 4, respectively. The NAND logic element 103B has an output terminal X which corresponds to the output terminal 27 of the NAND-type basic cell 103A of FIG. 4.

As shown in FIG. 4, basic cells are arranged in the row direction at fixed intervals, wherein basic cells that belong in one row are shifted by a distance corresponding to half of the sum of the basic cell rowwise width and the intercell distance, with respect to basic cells that belong in a row located next to the one row, thereby achieving a closest packing placement.

Additionally, it is designed such that two adjacent basic cells in the row direction are either two n-channel transistors or two p-channel transistors. For examnple, the NOR-type basic cell 102A is reversed by an angle of 180 degrees with respect to the NOR-type basic cell of the FIG. 1(c) mask layout diagram in order that the n-channel transistors of the NOR basic cell 102A may lie next to n-channel transistors of the inverter-type basic cell 101A and the NAND-type basic cell 103A.

Light refraction or interference in the lithography process and "rounding" in the etching, process of the LSI fabrication are known to occur particularly in relatively acute-angled figures, and such occurrence depends on the distance between figures and the form of figures.

In accordance with the present embodiment, all the basic cells have a hexagonal external contour and are arrayed in the row direction, whereby the basic cells, as figure, are spaced at regular intervals. Although this causes the angle of polygonal planar forms defined by post-LSI fabrication basic cells to become round (see FIG. 3), various damaging effects such as light interference taking place in the LSI fabrication of high miniaturization can be controlled. If basic cells of the present embodiment are regularly arranged in a matrix of rows and columns, this makes it possible to compute, within a realistic period of time, effects occurring, during the LSI fabrication, in transistors overlying a substrate such as "rounding", either by means of extraction of a submatrix of several basic cells xseveral basic cells to perform experimental fabrication of the extracted basic cells in an LSI fabrication step, or by performing the simulation of a photolithography process.

Further, each transistor is provided with an annularly-formed gate region, which produces the advantage that higher-level integration can be accomplished because the present invention eliminates the need for allowing a margin for coping with the tapering of gate electrode ends. Such a margin must be taken into consideration in conventional linear gate electrode mask patterns.

As shown in FIG. 4, of basic cells located next to one another in the column direction, those that belong in one row are inverted in order that either n-channel transistors N11 or p-channel transistors P11 may be arranged next to one another. As a result of such arrangement, the n-channel transistors N11 and the p-channel transistors P11 are linearly, continuously arranged, and p-well formation regions Pw and n-well formation regions Nw are likewise linearly, continuously arranged. If the well formation regions Pw and Nw exist in subdivinization fashion, this results in a drop in integration level due to spacing rules and to the overhead of substrate contacts. However, the continuous placement of the regions Pw and Nw in at least rows or columns achieves a reduction of the overhead.

Since the basic cells are arranged in such a way to be packed in closest fashion, this improves on the level of integration of SIC devices.

Even when the p-channel transistor P11 is inferior in electric characteristic to the n-channel transistor N11, such a characteristic difference can be corrected by making the central angle of the sectoral drain diffusion region of the transistor P11 greater than that of the sectoral drain diffusion region of the n-channel transistor N11 and by making the size of the p-channel transistor P11 greater than that of the n-channel transistor N11 (see FIGS. 1(*a*) through 1(*c*)). In the present embodiment, optimization may be achieved by adjustment on the central angle ratio of one sector (a diffusion region) to another, without making a change in the cell size per se.

In the present embodiment, the external contour of basic cells in a mask layout is a hexagon. Instead of using a hexagon as basic cell external contour, any other polygonal forms including a pentagon and more sided polygons or a circle may be employed with the same advantages as obtained in the present embodiment.

Second Embodiment

A second embodiment of the present invention is now described below.

FIGS. 6(*a*) through 6(*c*) are plane views of mask layouts of basic cells of different types in a SIC device of the standard cell architecture in accordance with the second embodiment. FIG. 6(*a*) shows a mask layout for an inverter-type basic cell as inverter logic element. FIG. 6(*b*) shows a mask layout for a NAND-type basic cell as NAND logic element. FIG. 6(*c*) shows a mask layout for a NOR-type basic cell as NOR logic element.

The inverter-type basic cell, shown in the FIG. 6(*a*) mask layout, includes one pair arrangement of CMOS devices, this arrangement being made up of an n-channel transistor N41 and a p-channel transistor P41. The external contour of the inverter-type basic cell is hexagonal. Element N41*g* is a first gate electrode portion that is annularly formed. The gate electrode portion N41*g* is connected in parallel to the p-channel transistor P41. Element N41*s* is a source diffusion region (a first source/drain diffusion region) that is formed inside the gate region 41*g*. Element N41*d* is a drain diffusion region (a second source/drain diffusion region) that is formed outside and along the first gate electrode portion N41*g*. Element P41*g* is a second gate electrode portion that is formed in such a way as to enclose the first gate electrode portion N41*g*. Element P41*d* is a drain diffusion region serving as a third source/drain diffusion region. The drain diffusion region P41*d* is formed inside and along the second gate electrode portion N41*g* without overlapping the drain diffusion region N41*d*. Element P41*s* is a source diffusion region serving as a fourth source/drain diffusion region. The source diffusion region P41*s* is formed outside and along the second gate electrode portion P41*g*. Element 43 is a metal layer that is used to provide connection between the drain diffusion regions N41*d* and P41*d* of the transistors N41 and P41. Element 44 is a contact that is used to provide connection between the drain diffusion region P41*d* or source diffusion region P41*s* of the p-channel transistor P41 and a power line. Element 45 is a contact that is used to provide connection between the drain diffusion region N41*d* or source diffusion N41*s* and a ground line. Element 46 is an input terminal of the inverter-type basic cell, serving also as a contact that is used to provide connection between signal lines and the first and second gate electrode portions N41*g* and P41*g*. Element 47 is an output terminal of the inverter-type basic cell, serving also as a contact that is used to provide connection between signal lines and the drain diffusion regions N41*d* and P41*d* of the transistors N41 and P41.

The NAND-type basic cell, shown in the FIG. 6(*b*) mask layout, includes two pair arrangements of CMOS devices, each of the two CMOS pair arrangements being made up of an n-channel transistor N41 and a p-channel transistor P41 The external contour of this NAND-type basic cell is hexagonal. In FIGS. 6(*b*) and 6(*a*), the same reference numerals have been applied to like structural elements, and the already-described elements are not discussed here. Element 53 is a metal layer that is used to provide connection between the drain diffusion regions P41*d* or between the source diffusion regions P41*s* of the p-channel transistors P41. Element 54 is a metal layer that is used to provide connection between the drain diffusion regions N41*d* or between the source diffusion regions N41*s* of the n-channel transistors N41. Element 55 is a metal layer that is used to provide connection between the drain diffusion region P41*d* of the p-channel transistor P41 and the drain diffusion region N41*d* of the n-channel transistor N41. 56A and 56B are input terminals of the NAND-type basic cell, serving also as contacts that are used to provide connection between signal lines and the first and second gate electrode portions N41*g* and P41*g* of the transistors N41 and P41. Element 57 is an output terminal of the NAND-type basic cell, serving also as a contact that is used to provide connection between signal lines and the drain diffusion regions N41*d* and P41*d* of the transistors N41 and P41.

Figure 6A:
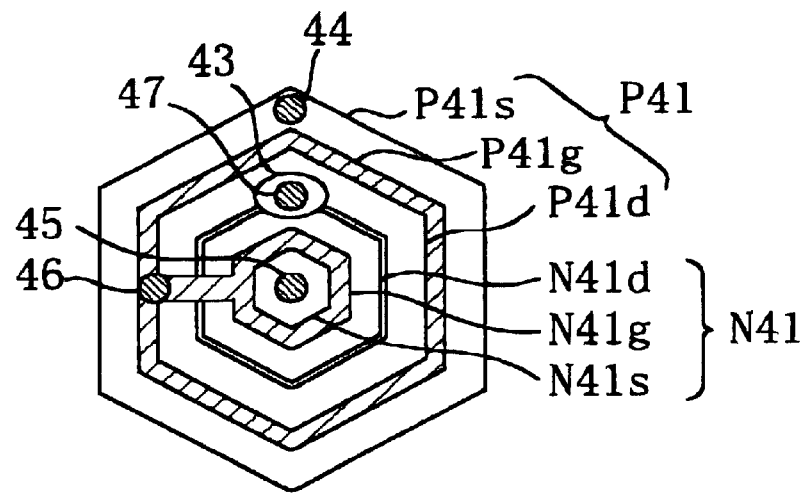
FIGS. 6(a) through 6(c) are plane views of mask layouts of basic cells of different types in a SIC device of the standard cell architecture in accordance with the second embodiment of the present invention.
Figure 6B:
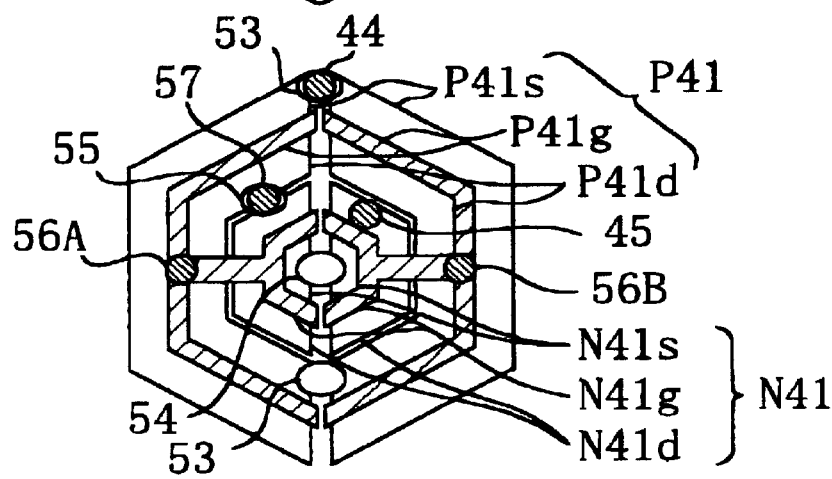
Figure 6C:
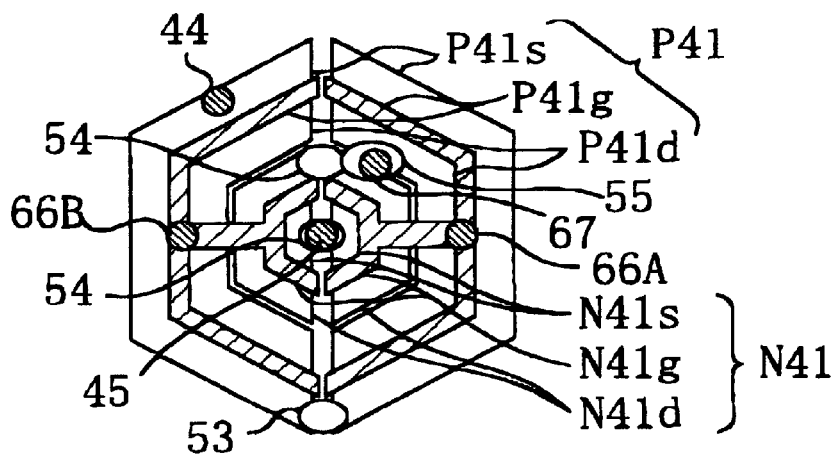

The NOR-type basic cell, shown in the FIG. 6(*c*) mask layout, includes two pair arrangements of CMOS devices, each of the two CMOS pair arrangements being made up of an n-channel transistor N41 and a p-channel transistor P41. The external contour of this NOR-type basic cell is hexagonal. In FIGS. 6(c) and 6(b), the same reference numerals have been applied to like structural elements, and the already-described elements are not discussed here. Element 66A and 66B are input terminals of the NOR-type basic cell, serving also as contacts that are used to provide connection between signal lines and the first and second gate electrode portions N41g and P41g of the transistors N41 and P41. Element 67 is an output terminal of the NOR-type basic cell, serving also as a contact that is used to provide connection between signal lines and the drain diffusion regions N41d and P41d of the transistors N41 and P41.

The basic cell circuit diagrams of FIGS. 6(a) through 6(c) correspond to the circuit diagrams of FIGS. 2(a) through 2(c), respectively. The input terminal A of FIG. 2(a) corresponds to the input terminal 46 of FIG. 6(a) and the output terminal Y corresponds to the output terminal 47 of FIG. 6(a). The input terminals A and B of FIG. 2(b) correspond to the input terminals 56A and 56B of FIG. 6(a), respectively, and the output terminal Y corresponds to the output terminal 57 of FIG. 6(b). The input terminals A and B shown in FIG. 2(c) correspond to the input terminals 66A and 66B shown in FIG. 6(c), respectively, and the output terminal Y corresponds to the output terminal 67 shown in FIG. 6(c).

Figure 7A:
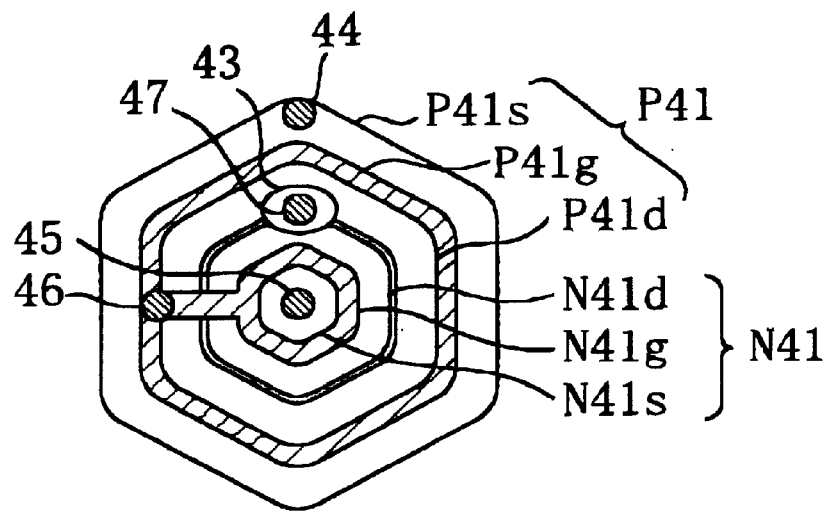
FIGS. 7(a) through 7(c) illustrate in plane a SIC device after an LSI fabrication step produced from mask layout diagrams of basic cells of the second embodiment of the present invention.
Figure 7B:
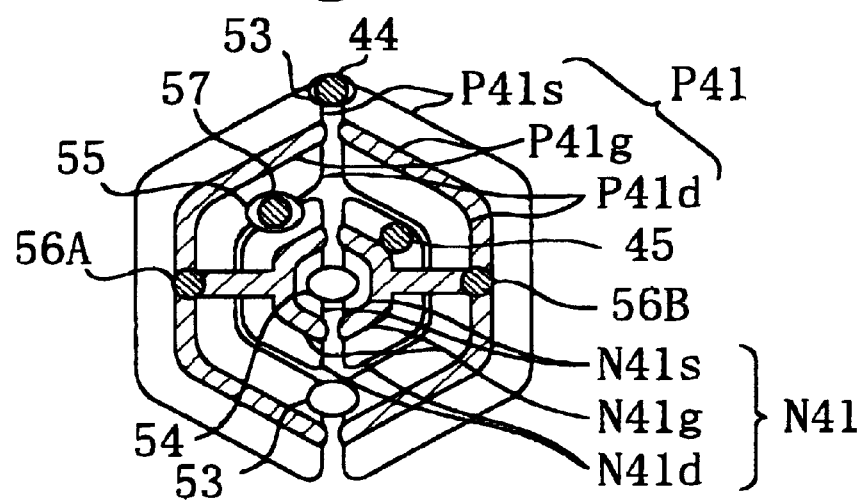
Figure 7C:
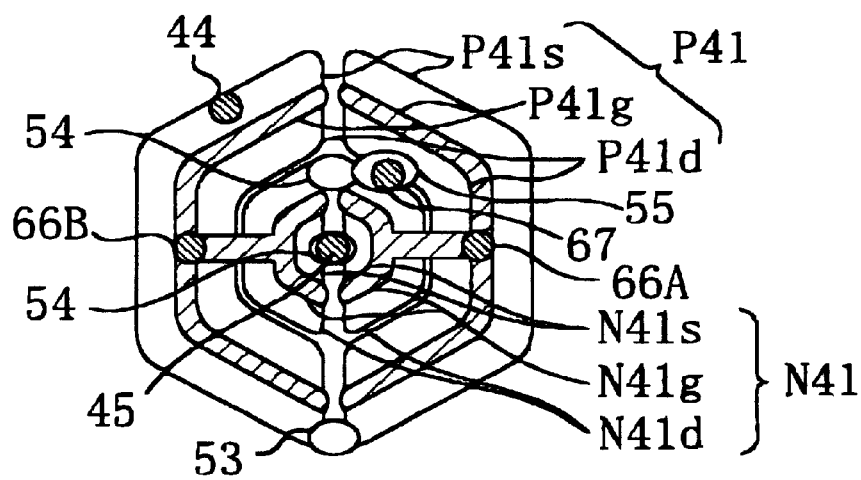

FIGS. 7(a) through 7(c) depict in plane a post-LSI fabrication SIC device produced from the basic cell mask layout diagrams of FIGS. 6(a) through 6(c). FIG. 7(a) is an illustration of an inverter-type basic cell. FIG. 7(b) is an illustration of a NAND-type basic cell. FIG. 7(c) is an illustration of a NOR-type basic cell. In FIGS. 6 and 7, the same reference numerals have been applied to like structural elements, and the already-described elements are not discussed here.

Figure 8:
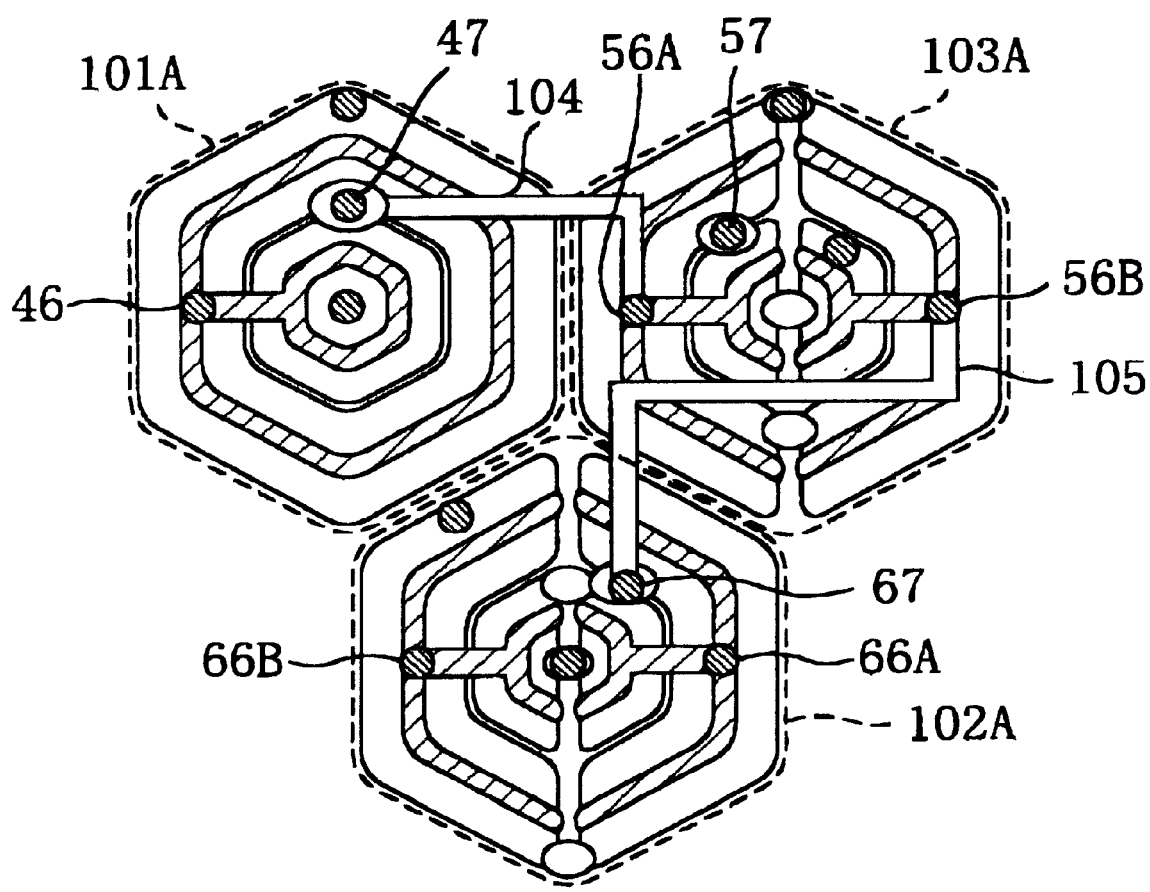
FIG. 8 depicts in plane a portion of a SIC device after an LSI fabrication step in a logic circuit produced from basic cells of the second embodiment of the present invention.

FIG. 8 depicts in plane a portion of a post-LSI fabrication SIC device in a logic circuit produced from basic cells having the mask layouts of FIGS. 6(a) through 6(c). Element 101A is an inverter-type basic cell. Element 102A is a NOR-type basic cell. Element 103A is a NAND-type basic cell. Element 104 is a signal line of a metal layer that is used to provide connection between an output terminal 47 of the inverter-type basic cell 101A and an input terminal 56A of the NAND-type basic cell 103A. Element 105 is a signal line of a metal layer that is used to provide connection between an output terminal 67 of the NOR-type basic cell 102A and an input terminal 56B of the NAND-type basic cell 103A. The logic circuit has input terminals 46, 66A, 66B and an output terminal 57.

As can be seen from FIG. 8, basic cells are arranged in the row direction at fixed intervals, wherein basic cells that belong in one row are shifted by a distance corresponding to half of the sum of the basic cell rowwise width and the intercell distance, with respect to basic cells that belong in a row located next to the one row, thereby achieving a 2-D closest packing placement. A concrete circuit for the basic cells of FIG. 8 is implemented by a logic circuit diagram shown in FIG. 5.

In accordance with the present embodiment, all the basic cells have a hexagonal external contour and are arrayed in the row direction, whereby the basic cells, as figure, are spaced at regular intervals. Although this causes the angle of polygonal planar forms defined by post-LSI fabrication basic cells to become round (see FIG. 7), various damaging effects such as light interference taking place in the LSI fabrication of high miniaturization can be controlled. If basic cells of the present embodiments are regularly arranged in a matrix of rows and columns, this makes it possible to compute, within a realistic period of time, effects occurring, during the LSI fabrication, in transistors overlying a substrate such as "rounding", either by experimentally fabricating a submatrix of several basic cells ×several basic cells in LSI fabrication processing or by performing the simulation of a photolithography process.

Since the basic cells are placed so as to be packed in closest fashion, this improves on the level of integration of SIC devices. Further, each transistor is provided with an annularly-formed gate region, which produces the advantage that higher-level integration can be accomplished because the present invention eliminates the need for allowing a margin for coping with the tapering of gate electrode ends. Such a margin must be taken into consideration in conventional linear gate electrode mask patterns.

Even when the p-channel transistor P41 is inferior in electric characteristic to the n-channel transistor N41, such a characteristic difference can be corrected by making the size of the p-channel transistor P41 greater than that of the n-channel transistor N41. In the present embodiment, of the first and second gate electrode portions N41g and P41g that are concentrically formed, one that is external to the other and increases in gate width, i.e., the second gate electrode portion P41g, is made to serve as a p-channel transistor, and optimization may be achieved by making a change in the radial ratio of the first gate electrode portion N41g to the second gate electrode portion P41g without making a change in basic cell size.

In the present embodiment, the external contour of basic cells in a mask layout is a hexagon. Instead of using a hexagon as basic cell external contour, any other polygonal forms including a pentagon and more sided polygons or a circle may be employed with the same advantages as obtained in the present embodiment.

Third Embodiment

A third embodiment of the present invention is now described below.

Figure 9:
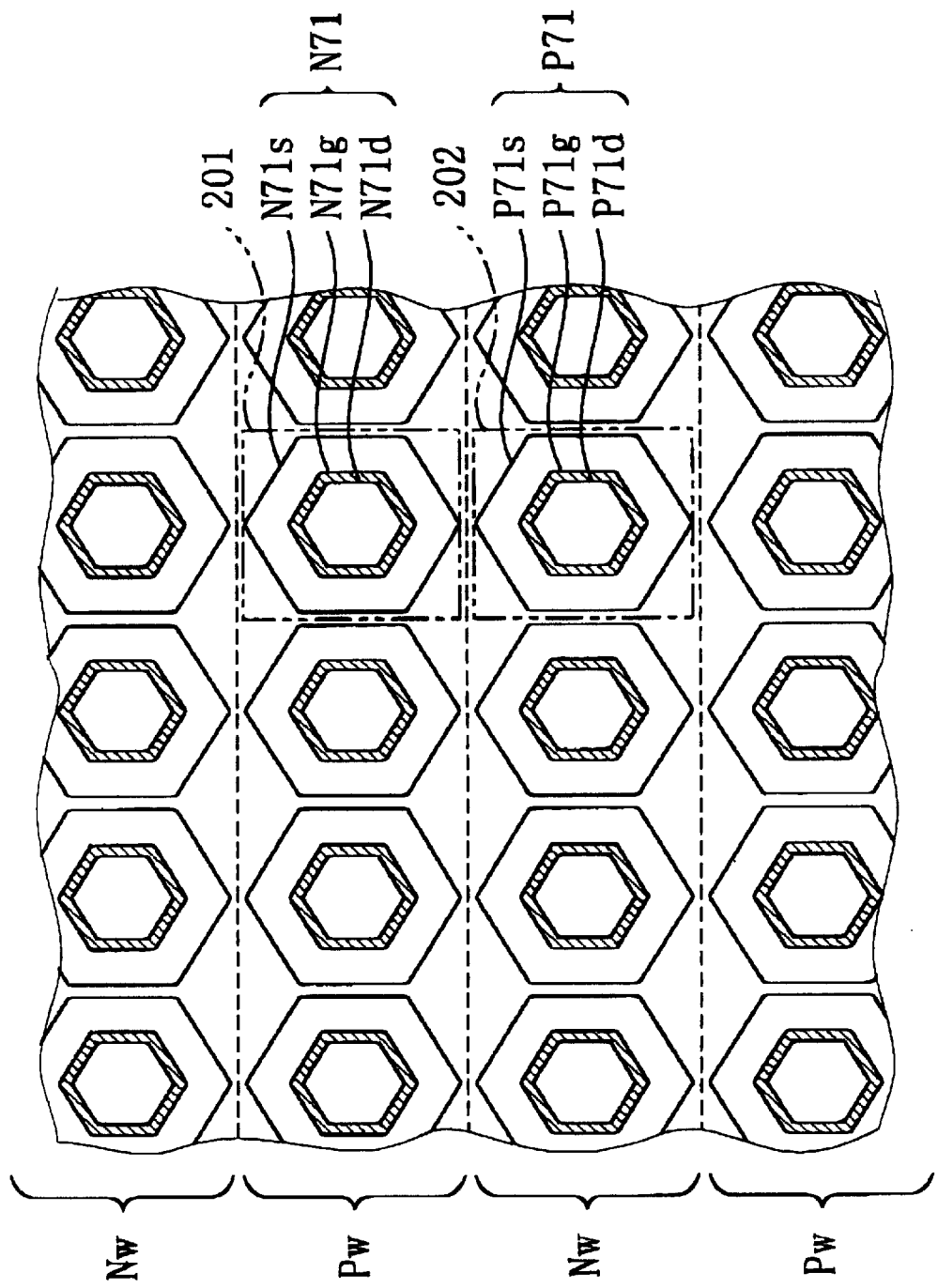
FIG. 9 is a plane view of a mask layout of an underlying layer in a SIC device of the gate array architecture constructed in accordance with the third embodiment of the present invention.

FIG. 9 is a plane view of a mask layout of an underlaying layer in a SIC device of the gate array architecture in accordance with the present embodiment. Here, a basic cell of the gate array architecture means an n-type basic cell of n-channel transistors or a p-type basic cell of p-channel transistors for forming a logic cell. Referring to FIG. 9, 201 is a mask layout of an n-type basic cell in which is contained a single n-channel transistor N71. Element 202 is a mask layout of a p-type basic cell in which is contained a single p-channel transistor P71. The n-channel transistor N71 has a gate region N71g that is annularly formed, a drain diffusion region N71d (a first source/drain diffusion region) formed inside the gate region N71g, and a source diffusion region N71s (a second source/drain region) formed outside the gate drain region N71g and having a hexagonal contour. Likewise, the p-channel transistor P71 has a gate region P71g that is annularly formed, a drain diffusion region P71d (a first source/drain diffusion region) formed inside the gate region P71g, and a source diffusion region P71s (a second source/drain region) formed outside the gate drain region P71g and having a hexagonal contour. A p-well formation region is labeled Pw. Formed in the p-well formation region Pw are the n-channel transistors N71. An n-well formation region is labeled Nw. Formed in the n-well formation region Nw are the p-channel transistors P71.

It is designed such that the n-channel transistor N71 and the p-channel transistor P71 are identical in size with each other. This means that the n-type basic cell 201 and the p-type basic cell 202 are identical in size with each other. Series of basic cells of the same type are linearly arranged in one row at fixed intervals, and the rows of the n-channel transistors N71 and the rows of the p-channel transistors P71 are repeated at fixed intervals in alternating fashion in the column direction. The basic cell external contour may be dealt with as a square as defined by chain double-dashed line of FIG. 9.

Figure 10:
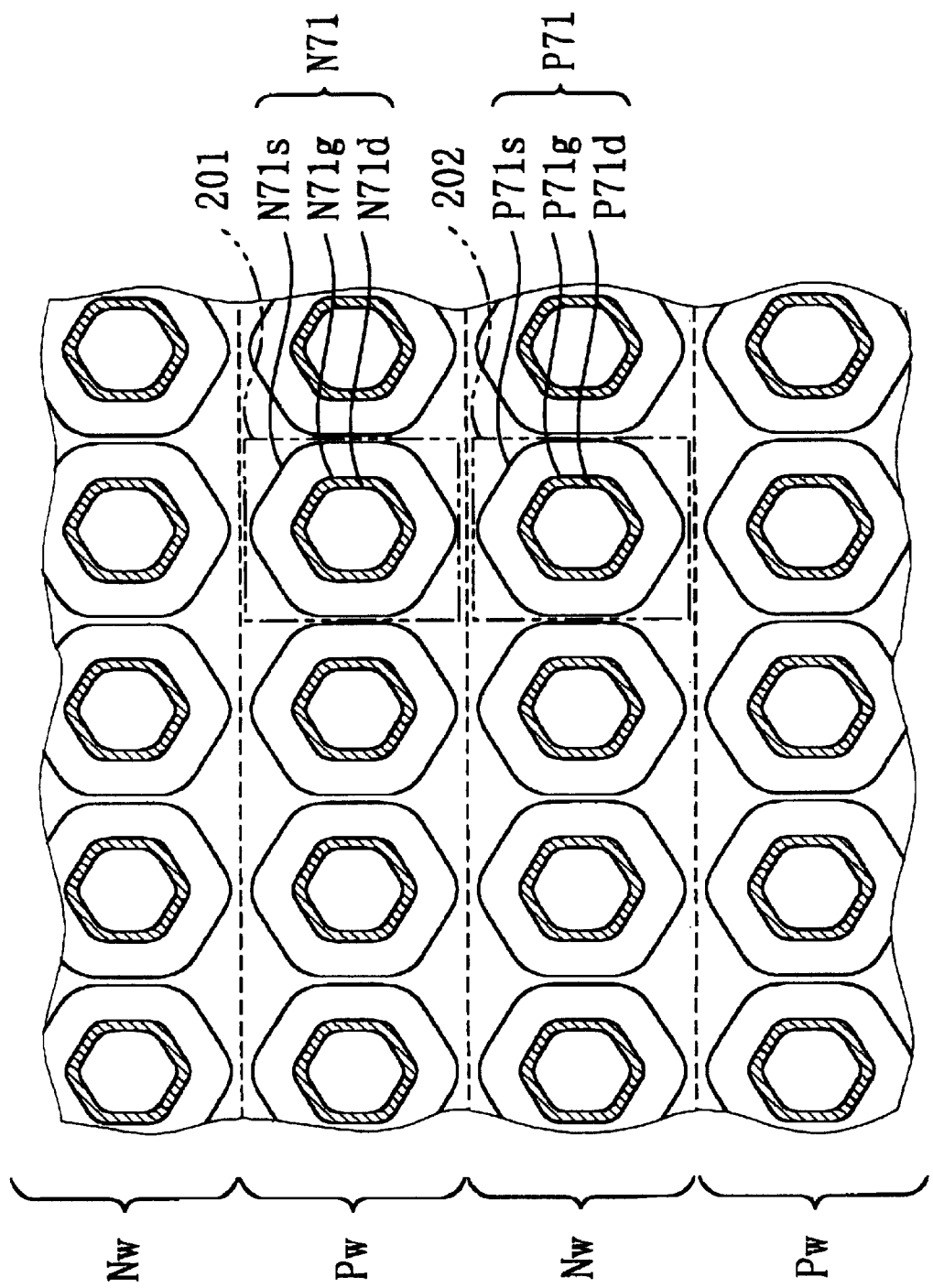
FIG. 10 is a plane view of an underlying layer of a post-LSI fabrication SIC device produced from a mask layout diagram of the third embodiment of the present invention.

FIG. 10 is a plane view of an underlying layer of a SIC device after an LSI fabrication step produced from the FIG. 9 mask layout. In FIGS. 9 and 10, the same reference numerals have been applied to like structural elements, and the already-described elements are not discussed here.

As described above, the n-channel transistors N71 and the p-channel transistors P71 are constructed of combinations of identical hexagonal figures, so that, when compared with combinations of identical rectangular figures, each figure's interior angle exceeds 90 degrees. Additionally, the transistors are regularly placed in a matrix of rows and columns, as a result of which the figures are laid out at regular intervals.

As previously mentioned, light refraction or interference in the lithography process and "rounding" in the etching process of the LSI fabrication are known to occur particularly in relatively acute-angled figures, and such occurrence depends on the distance between figures and the form of figures.

When making a comparison between FIG. 10 transistor figures and their corresponding FIG. 9 figures, it can be seen that the interior angle of the former transistor FIGS. becomes somewhat rounder than that of the latter figures; however, damaging effects taking place in the fabrication of LSIs of advanced miniaturization can be controlled to a further extent.

Since the n-channel transistors N71 and the p-channel transistors P71 are regularly arranged in a matrix of rows and columns, this makes it possible to compute, within a realistic period of time, effects occurring, during the LSI fabrication, in transistors overlying a substrate such as "rounding", either by means of extraction of a submatrix of several basic cells×several basic cells to perform experimental fabrication of the extracted basic cells in an LSI fabrication step, or by performing the simulation of a photolithography process.

Transistors of the same type are arranged in the row direction. Neither the p-well formation regions Pw nor the n-well formation regions Nw are cut off at every transistor. Both the regions Pw and Nw are continuously arranged in rows. This achieves a suitably reduction of the number of substrate contacts, and the provision of intervals for separating the p- and n-well formation regions Pw and Nw from one another is required only in the column direction, thereby further improving on the level of integration.

Further, each transistor is provided with an annularly-formed gate region, which produces the advantage that higher-level level integration can be accomplished because the present invention eliminates the need for allowing a margin for coping with the tapering of gate electrode ends. Such a margin must be taken into consideration in conventional linear gate electrode mask patterns.

For convenience, in FIGS. 9 and 10 only the underlaying layer is diagramed; however, an actual SIC device has polysilicon layers, contacts that are used to provide connection with overlying metal layers, and interconnection lines, wherein a suitable combination of the n-channel transistors N71 and the p-channel transistors P71 constitutes a target logic circuit.

In the present embodiment, the external contour of transistors in a mask layout is a hexagon. Instead of using a hexagon as basic cell external contour, any other polygonal forms including a pentagon and more sided polygons or a circle may be employed with the same advantages as obtained in the present embodiment.

The present embodiment shows a mask layout for an underlying layer in a SIC device according to the gate array architecture. Such a mask layout may be one for an underlying layer in a SIC device according to the standard cell architecture.

Fourth Embodiment

A fourth embodiment of the present invention is now described.

Figure 11:
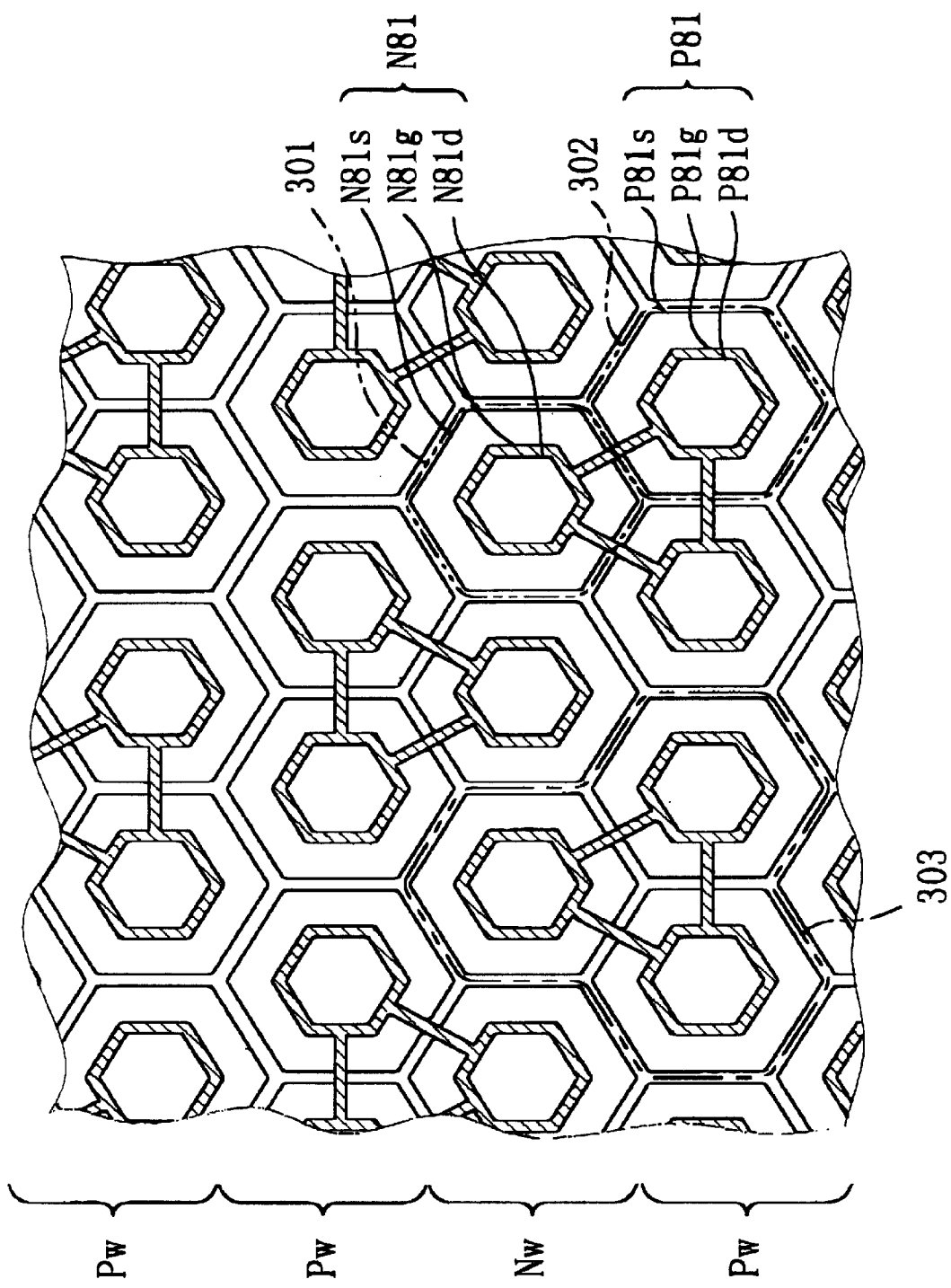
FIG. 11 is a plane view of a mask layout of an underlying layer in a SIC device of the gate array architecture constructed in accordance with the fourth embodiment of the present invention.

FIG. 11 is a plan view of a mask layout of an underlying layer in a SIC device of the gate array architecture in accordance with the fourth embodiment of the present invention. Here, a basic cell of the gate array architecture means either an n-channel transistor or p-channel transistor for use in formation of a logic cell. Referring to FIG. 11, 301 is a mask layout of an n-type basic cell. The n-type basic cell 301 contains therein a single n-channel transistor N81. Element 302 is a mask layout of a p-type basic cell. The p-type basic cell 302 contains therein a single p-channel transistor P81. The n-channel transistor N81 has an annularly-formed gate region N81g, a drain diffusion region N81d (a first source/drain diffusion region) formed inside the gate region N81g, and a source diffusion region N81s (a second source/drain diffusion region) formed along and outside the gate region N81g and having a hexagonal contour. Likewise, the p-channel transistor P81 has an annularly-formed gate region P81g, a drain diffusion region P81d (a first source/drain diffusion region) formed inside the gate region P81g, and a source diffusion region P81s (a second source/drain diffusion region) formed along and outside the gate region P81g and having a hexagonal contour.

It is designed such that the n-channel transistor N81 and the p-channel transistor P81 are identical in size with each other. This means that the n-type basic cell 301 and the p-type basic cell 302 are identical in size with each other. As a result, basic cells of the same type are linearly placed in one row at fixed intervals, and the rows of the n-channel transistors N81 and the rows of the p-channel transistors P81 are arranged in alternating fashion in the column direction. Referring to FIG. 11, therein formed is a CMOS device 303 as a logic element composed of one n-channel transistor N81 and two p-channel transistors P81 these transistors being located next to one another. The gate regions N81g and P81g of the CMOS device 303 are electrically interconnected. In order to achieve an effective layout of CMOS devices 303 which each comprise one n-channel transistor N81 and two p-channel transistors F81 (the component ratio is one to two), a pattern in which two consecutive rows of the p-type basic cells 302 are arranged for every one row of the n-type basic cell 301, is repeated in the column direction with a rowwise shift for half of the fixed interval for every one line, i.e., by half-pitch.

As shown in FIG. 10, the basic cells of the present embodiment are arranged such that they are packed in closest fashion in 2D, as a result of which the external contour of each basic cell can be dealt with as having the same external contour as each transistor (i.e., a hexagonal external contour).

A gate array structure, as used in the present embodiment, contains no prespecified circuitry. Accordingly, for convenience' sake, regions internal to the transistor gate region are called a drain diffusion region, while regions external to the transistor gate region are called a source diffusion region. However, once interconnections are determined, a region on the ground potential side is determined to act as a source diffusion region for the case of n-channel transistors, and a region on the power potential side is determined to act as a source diffusion region for the case of p-channel transistors.

Figure 12:
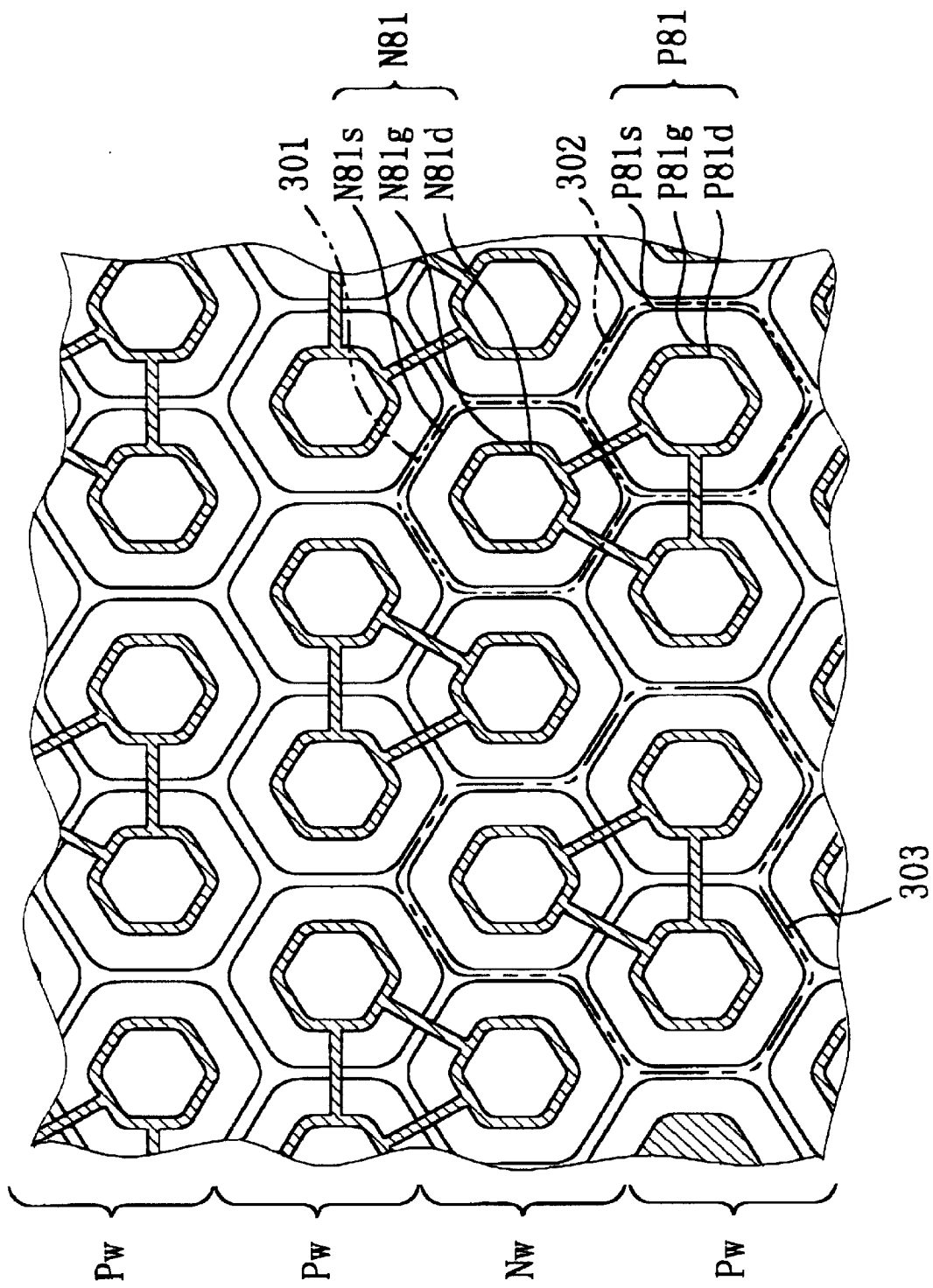
FIG. 12 is a plane view of an underlying layer of a post-LSI fabrication SIC device produced from a mask layout diagram of the fourth embodiment of the present invention.

FIG. 12 is a plan view of an underlying layer of a SIC device after an LSI fabrication step produced from the FIG. 11 mask layout. In FIGS. 11 and 12, the same reference numerals have been applied to like structural elements, and the already-described elements are not discussed here.

A logic circuit formed by making use of basic cells formed of the above-described underlying layer is now described below.

Figure 13:
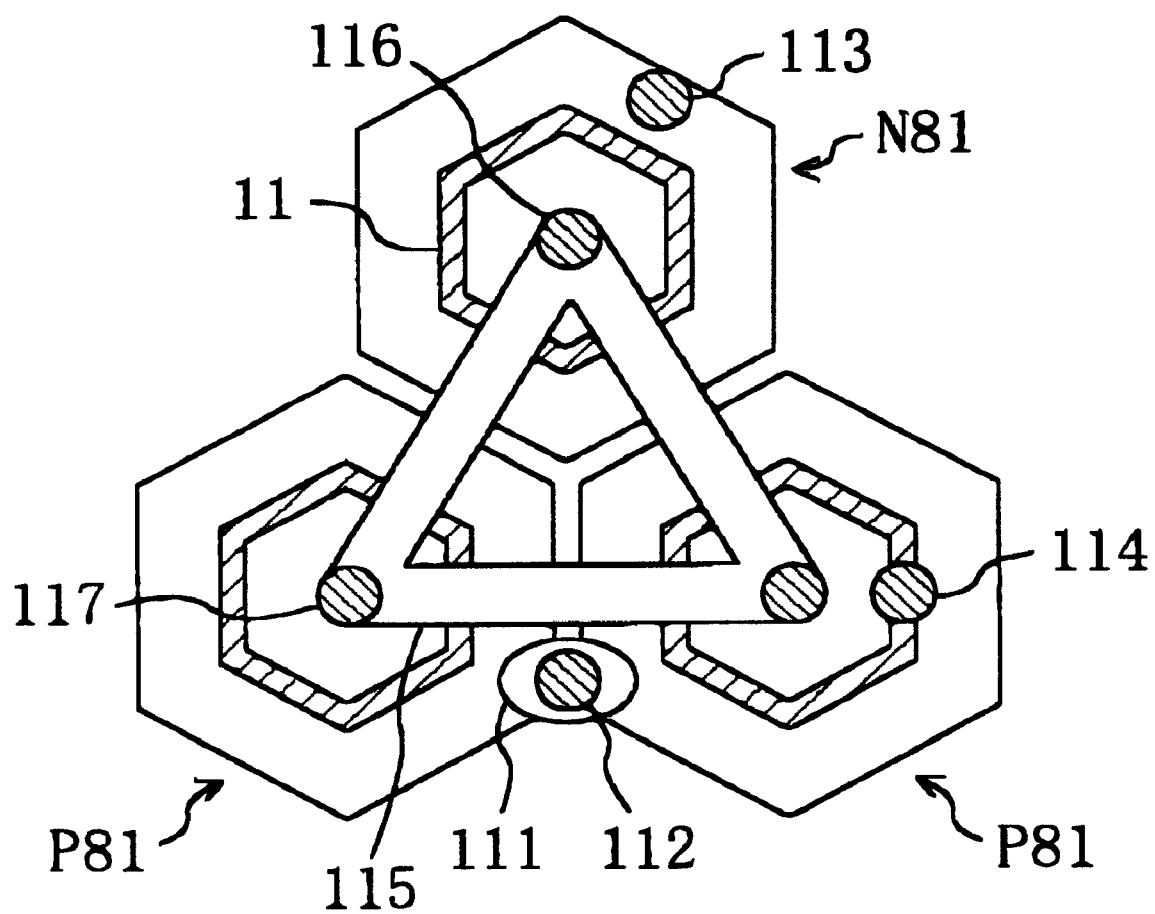
FIG. 13 is a plane view of a mask layout of an inverter-type logic cell constructed by a combination of basic cells of the fourth embodiment of the present invention.
Figure 14:
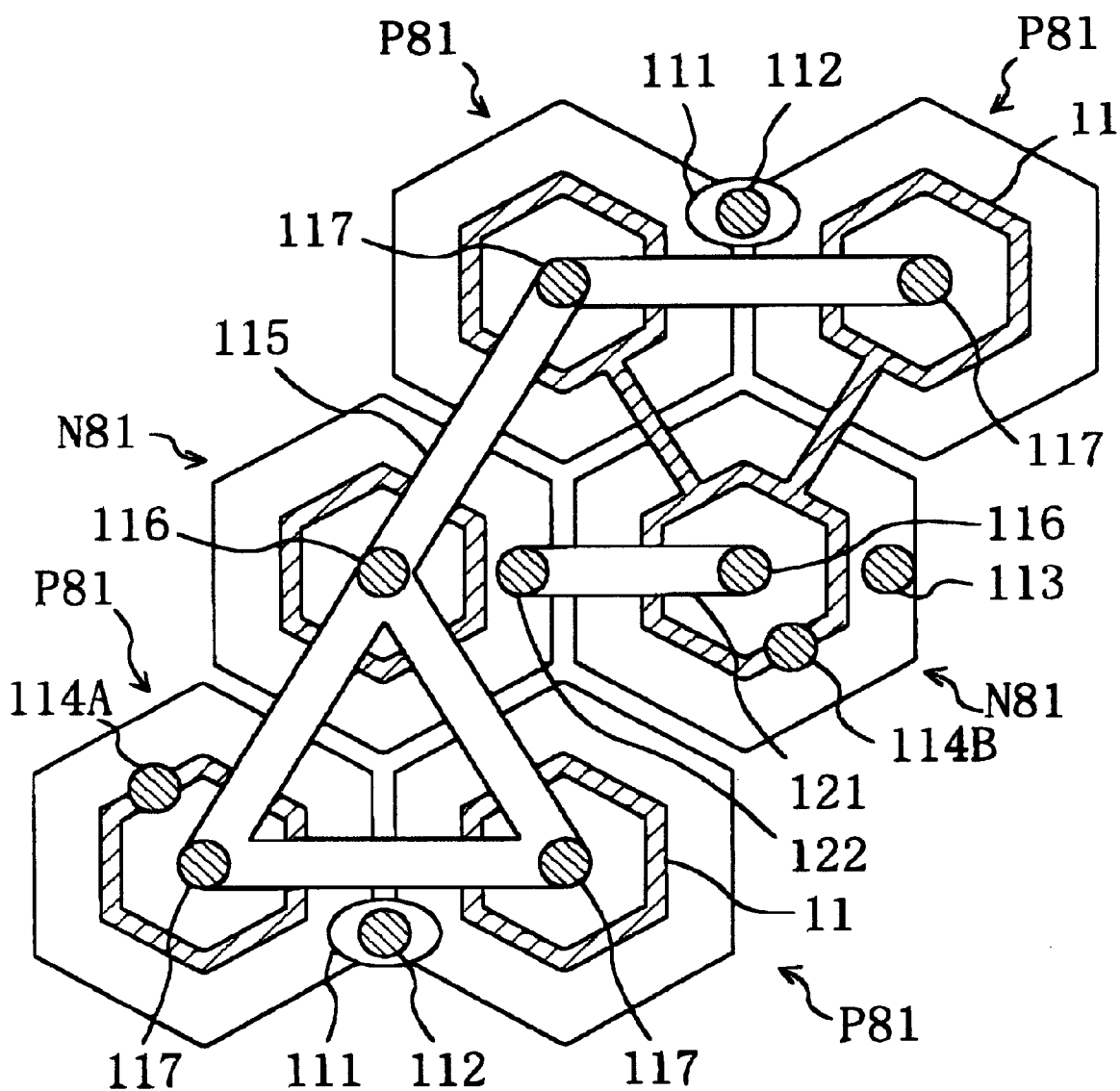
FIG. 14 is a plane view of a mask layout of a NAND-type logic cell constructed by a combination of basic cells of the fourth embodiment of the present invention.
Figure 15:
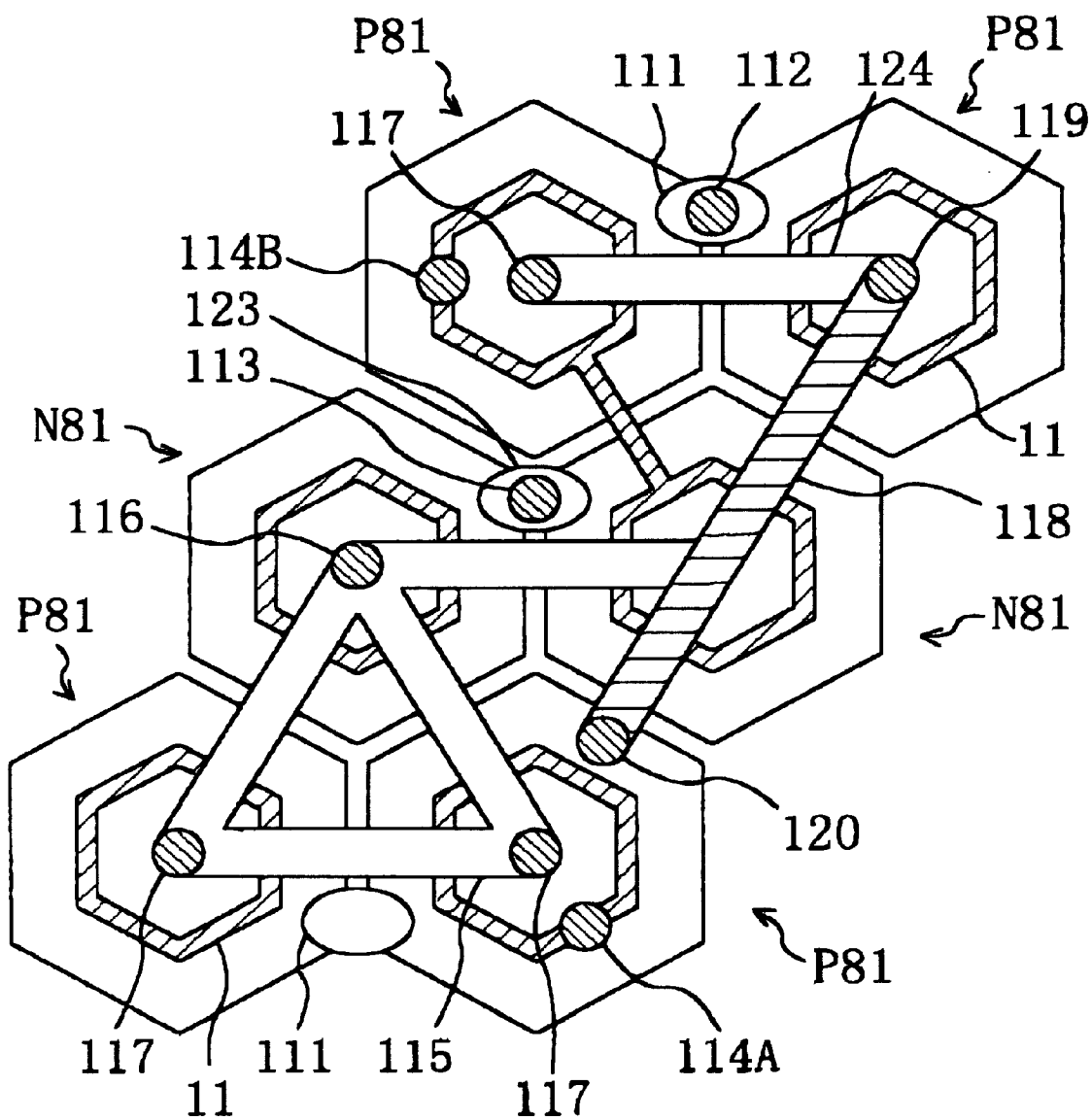
FIG. 15 is a plane view of a mask layout of a NOR type logic cell constructed by a combination of basic cells of the fourth embodiment of the present invention.

FIGS. 13 through 15 depict planar structures of mask layouts including components required at the time of forming a base logic circuit such as a metal layer, a polysilicon layer, and a contact that is used to provide connection between the polysilicon layer and the metal layer. Only components necessary for forming the logic circuit are diagramed here.

FIG. 13 is an illustration of an inverter-type logic cell formed of the CMOS device 303 that is made up of one n-channel transistor N81 and two p-channel transistors P81 wherein the gate regions of the transistors N81 and P81 are connected together. Each transistor gate region is denoted by reference numeral 11. Element 111 denotes a metal layer that is used to provide connection between the source diffusion regions of the two p-channel transistors P81. Element 112 is a contact that is used to provide connection between the metal layer 111 and a power line. Element 113 is a contact that is used to provide connection between the source diffusion region of the n-channel transistor N81 and a ground line. Element 114 is an input terminal of the inverter circuit, serving also as a contact that is used to provide connection between a signal line and the gate region 11. Element 115 is a signal line formed of a metal layer that is used to provide connection between the drain diffusion region of the n-channel transistor N81 and the drain diffusion region of the p-channel transistor P81, serving also as an output line of the inverter circuit. Element 116 is a contact that is used to provide connection between the signal line 115 and the drain diffusion region of the n-channel transistor N81. Element 117 is a contact that is used to provide connection between the signal line 115 and the drain diffusion region of the p-channel transistor P81.

FIG. 14 depicts a NAND-type logic cell formed of two pair arrangements of CMOS devices 303. Element referring to FIG. 14, each transistor gate region is denoted by reference numeral 11. Element 111 is a metal layer that is used to provide connection between the source diffusion regions of adjacent p-channel transistors P81. Element 112 is a contact that is used to provide connection between the metal layer 111 and a power line. 113 is a contact that is used to provide connection between the source diffusion region of the n-channel transistor N81 and a ground line. Element 114A is a first input terminal of the NAND circuit, serving also as a contact that is used to provide connection between signal lines and the gate regions 11 of one of the CMOS devices 303. 114B is a second input terminal of the NAND circuit, serving also as a contact that is used to provide connection between signal lines and the gate regions 11 of the other CMOS device 303. Element 115 is a signal line formed of a metal layer that is used to provide connection between the drain diffusion regions of one of the CMOS devices 303 and the drain diffusion regions of the two p-channel transistors P81 of the other CMOS device 303, serving also as an output line of the NAND circuit. 121 is a signal line that is used to provide in-series connection between the n-channel transistors N81. Element 116 is a contact that is used to provide connection between the signal line 121 and the drain diffusion region of the n-channel transistor NB1 of the one CMOS devices 303. Element 122 is a contact that is used to provide connection between the signal line 121 and the source diffusion region of the n-channel transistor N81 of the other CMOS device 303. Element 117 is a contact that is used to provide connection between the signal line 115 and the drain diffusion region of the p-channel transistor P81.

FIG. 15 is an illustration of a NOR-type logic cell formed of two pair arrangements of CMOS devices 303 shown in FIG. 11. Referring to FIG. 15, each transistor gate region is denoted by reference numeral 11. Element 111 is a metal layer that is used to provide connection between the source diffusion regions of the adjacent p-channel transistors P81. 112 is a contact that is used to provide connection between the metal layer 111 and a power line. Element 123 is a metal layer that is used to provide connection between the source diffusion regions of the adjacent n-channel transistors N81. 113 is a contact that is used to provide connection between the metal layer 123 and a ground line. Element 114A is a first input terminal of the NOR circuit, serving also as a contact that is used to provide connection between signal lines and the gate regions 11 of one of the CMOS devices 303. Element 114B is a second input terminal of the NOR circuit, serving also as a contact that is used to provide connection between signal lines and the gate regions 11 of the other CMOS device 303. 115 is a signal line formed of a fist metal layer that is used to provide connection between the drain diffusion regions 11 of one of the CMOS devices 303 and the drain diffusion region of the n-channel transistor N81 of the other CMOS device 303, serving also as an output line of the NOR circuit. 124 is a signal line formed of the first metal layer that is used to provide connection between the drain diffusion regions of the adjacent p-channel transistors P81. 116 is a contact that is used to provide connection between a signal line formed of the first metal layer and the drain diffusion region of the n-channel transistor N81. 117 is a contact that is used to provide connection between a signal line formed of the first metal layer and the drain diffusion region of the p-channel transistor P81. 118 is a signal line formed of a second metal layer that is used to provide connection between the source diffusion region of the p-channel transistor P81 of the one CMOS device 303 and the drain diffusion region of the p-channel transistor P81 of the other CMOS device 303. In addition, the signal line 118 is for connecting in series the two p-channel transistors P81 of the CMOS device 303. 119 is a contact that is used to provide connection between the contact 117 and the signal line 118. 120 is a contact that is used to provide connection between the signal line 118 and the source diffusion region of the p-channel transistor P81 of the one CMOS device 303.

Figure 16:
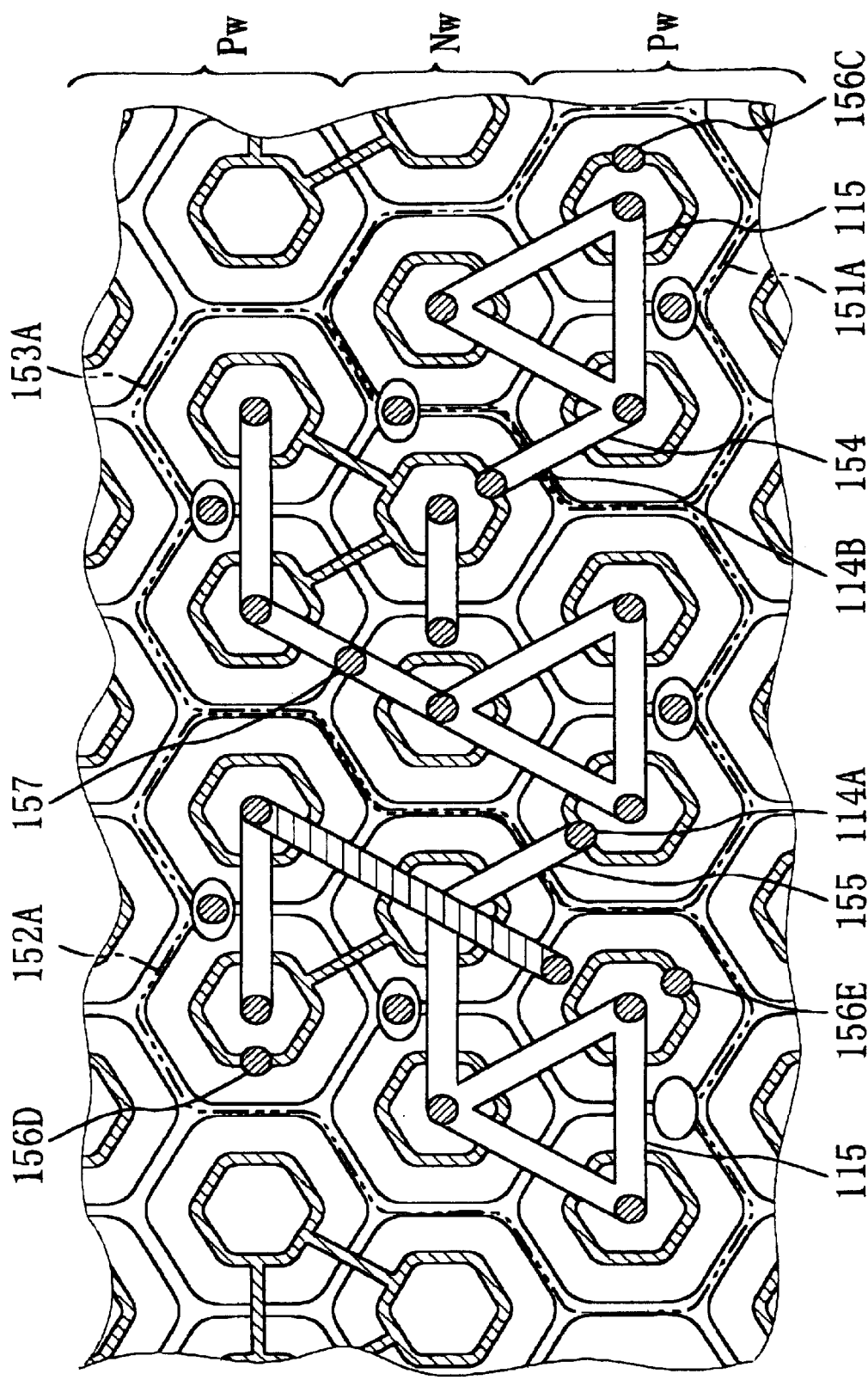
FIG. 16 is a plane view of a post-LSI fabrication SIC device produced from mask layout diagrams of logic cells of the fourth embodiment of the present invention.

FIG. 16 illustrates the FIG. 5 logic circuit that has been produced from the FIGS. 13–15 logic cells mask layouts and is a plan view of a portion of a SIC device after an LSI fabrication step. In FIGS. 13 through 16, the same reference numerals have been applied to like structural elements, and the already-described elements are not discussed here. 151A is an inverter circuit. Element 152A is a NOR circuit. Element 153A is a NAND circuit. Element 154 is a signal line formed of a metal layer which establishes connection between an output terminal of the inverter circuit 151A and a second input terminal 114B of the NAND circuit 153A. Element 155 is a signal line formed of a metal layer which establishes connection between an output terminal of the NOR circuit 152A and a first input terminal 114A of the NAND circuit 153A. The logic circuit has input terminals 156C, 156D, and 156E and an output terminal 157.

As described above, the n-type basic cells 301 and the p-type basic cells 302 are constructed of combinations of identical hexagonal figures, so that, when compared with combinations of identical rectangular figures, each figure's interior angle exceeds 90 degrees. Additionally, the basic cells are regularly placed in a matrix of rows and columns, as a result of which the figures are laid out at regular intervals.

When making a comparison between FIG. 12 transistor figures and their corresponding FIG. 11 figures, it can be seen that the interior angle of the former transistor figures becomes somewhat rounder than that of the latter figures; however, damaging effects taking place in the fabrication of LSis of advanced miniaturization can be controlled to a further extent.

The n-type basic cells 301 and the p-type basic cells 302 are regularly arranged in a matrix of rows and columns, thereby making it possible to compute, within a realistic period of time, effects occurring, during the LSI fabrication, in transistors overlying a substrate such as "rounding", either by extracting a submatrix of several basic cells× several basic cells and experimentally fabricating the extracted basic cells in an LSI fabrication step or by performing the simulation of a photolithography process. Additionally, since the basic cells are shifted by half of the fixed interval for every one line, i.e., by half-pitch, they are placed in closest packing fashion in 2D. As a result, further higher-level integration can be realized.

Transistors of the same type are arranged in the row direction. Neither the p-well formation regions Pw nor the n-well formation regions Nw are cut off at every transistor. Both the regions Pw and Nw are continuously arranged in rows. This achieves a suitably reduction of the number of substrate contacts, and the provision of intervals for separating the p- and n-well formation regions Pw and Nw from one another is required only in the column direction, thereby further improving on the level of integration.

The CMOS device 303 is formed of a combination of one n-channel transistor N81 and two p-channel transistors P81 wherein the gate region N81g and the gate region P81g are connected together in parallel. As a result of such arrangement, even when the p-channel transistor P81 is inferior in electric characteristic such as the value of saturation current to the n-channel transistor N81, the balance in electric characteristic between the p-channel transistor's P81 side and the n-channel transistor's N81 side can be achieved by connecting together not only the source regions but also the drain regions of the two p-channel transistors P81 in parallel.

Further, each transistor is provided with an annularly-formed gate region, which produces the advantage that higher-level integration can be accomplished because the present invention eliminates the need for allowing a margin for coping with the tapering of gate electrode ends. Such a margin must be taken into consideration in conventional linear gate electrode mask patterns.

The FIG. 16 logic circuit is just an example. A target logic circuit may be constructed by suitably combining CMOS transistors formed of basic cells that are regularly arranged with, for example, interconnection lines (metal layers), polysilicon layers, and contacts for establishing connection with overlying layers.

In the present embodiment, the external contour of basic cells in a mask layout is a hexagon. Instead of using a hexagon as basic cell external contour, any other polygonal forms including a pentagon and more sided polygons or a circle may be employed with the same advantages as obtained in the present embodiment.

The present embodiment shows a mask layout for an underlying layer in a SIC device according to the gate array architecture. Such a mask layout may be one for an underlying layer in a SIC device according to the standard cell architecture.

Fifth Embodiment

A fifth embodiment of the present invention is now described below.

Figure 17:
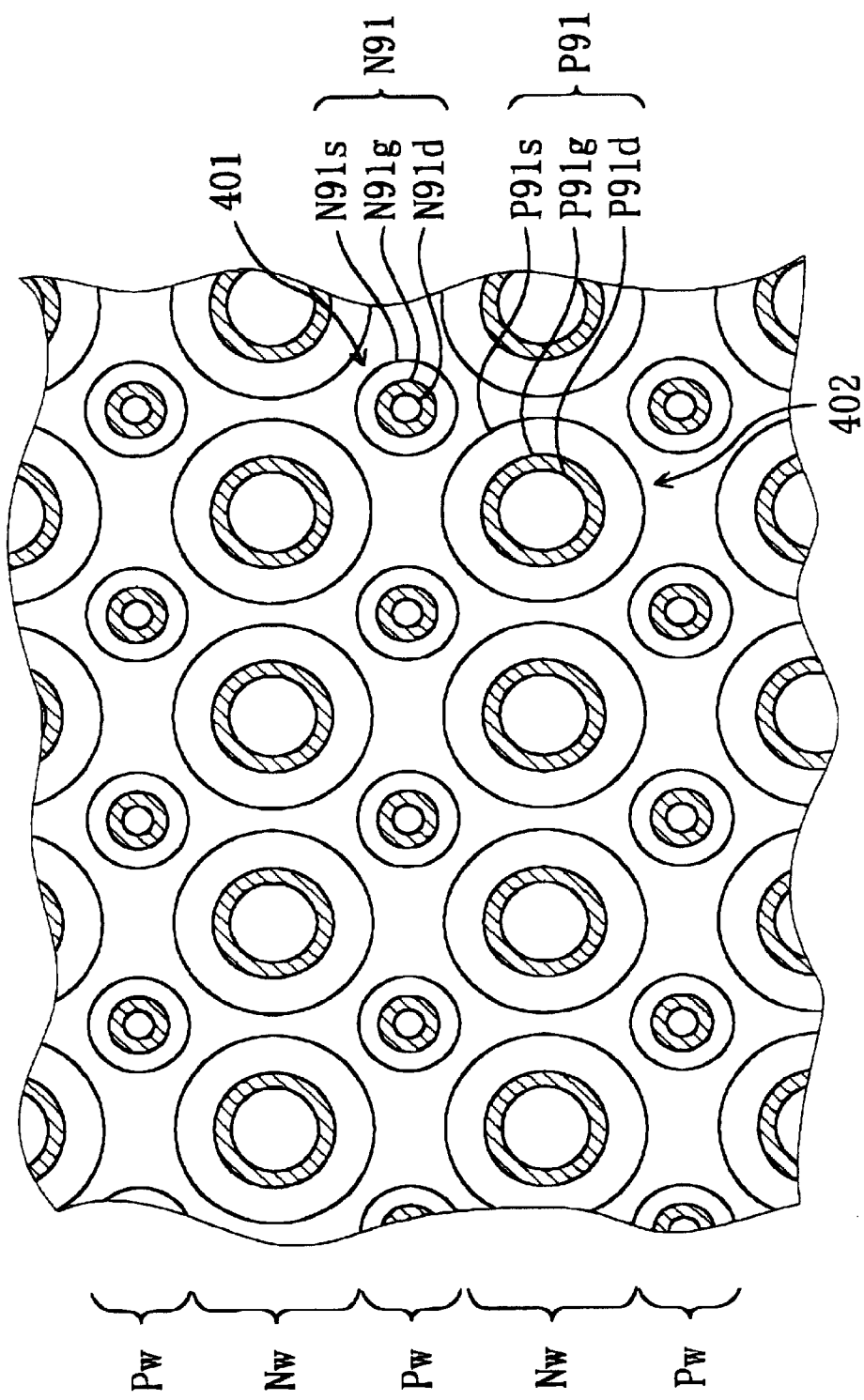
FIG. 17 is a plane view of a mask layout of an underlying layer in a SIC device of the gate array architecture according to the fifth embodiment of the present invention.

FIG. 17 depicts in plane a mask layout of an underlying layer in a SIC device of the gate array architecture in accordance with the fifth embodiment of the present invention. Referring to FIG. 17, 401 is a mask layout of an n-type basic cell. The n-type basic cell 401 contains therein a single n-channel transistor N91. Element 402 is a mask layout of a p-type basic cell. The p-type basic cell 402 contains therein a single p-channel transistor P91. The n-channel transistor N91 has an annularly-formed gate region N91g, a drain diffusion region N91d (a first source/drain diffusion region) formed inside the gate region N91g, and a source diffusion region N91s (a second source/drain diffusion region) formed along and outside the gate region N91g and having a circular contour. Likewise, the p-channel transistor P91 has an annularly-formed gate region P91g having a diameter greater than that of the n-channel transistor N91, a drain diffusion region P91d (a first source/drain diffusion region) formed inside the gate region P91g, and a source diffusion region P91s (a second source/drain diffusion region) formed along and outside the gate region P91g and having a circular contour.

The n-type basic cells 401 and the p-type basic cells 402 are linearly arranged in the row direction at fixed intervals, forming respective rows. In other words, the n-type basic cells 401 and the p-type basic cells 402 are arranged in rows in alternating fashion in the column direction with a rowwise cell shift for half of the fixed interval for every one line.

A gate array structure, as used in the present embodiment, contains no prespecified circuitry. Accordingly, for convenience' sake, regions internal to the transistor gate region are called a drain diffusion region, while regions external to the transistor gate region are called a source diffusion region. However, once interconnections are determined, a region on the ground potential side is determined to act as a source diffusion region for the case of n-channel transistors, and a region on the power potential side is determined to act as a source diffusion region for the case of p-channel transistors.

Figure 18:
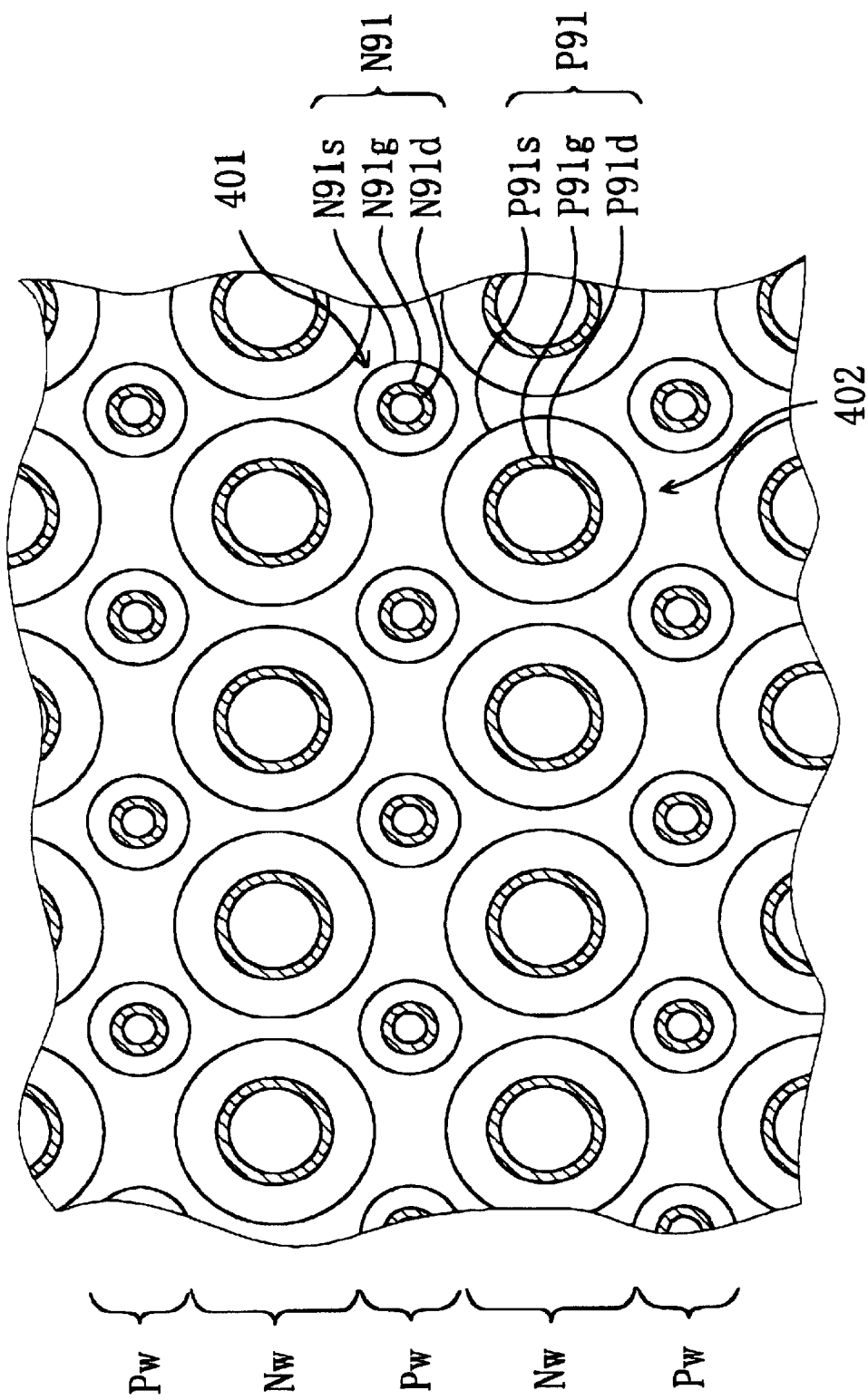
FIG. 18 is a plane view of an underlying layer of a post-LST fabrication SIC device produced from a mask layout diagram according to the fifth embodiment of the present invention.

FIG. 18 is a plan view of an underlying layer of a SIC device after an LSI fabrication step that was produced using the FIG. 12 mask layout diagram. In FIGS. 12 and 18, the same reference numerals have been applied to like structural elements, and the already-described elements are not discussed here.

A logic circuit formed by making use of basic cells of an underlying layer as constructed above is now described below.

Figure 19:
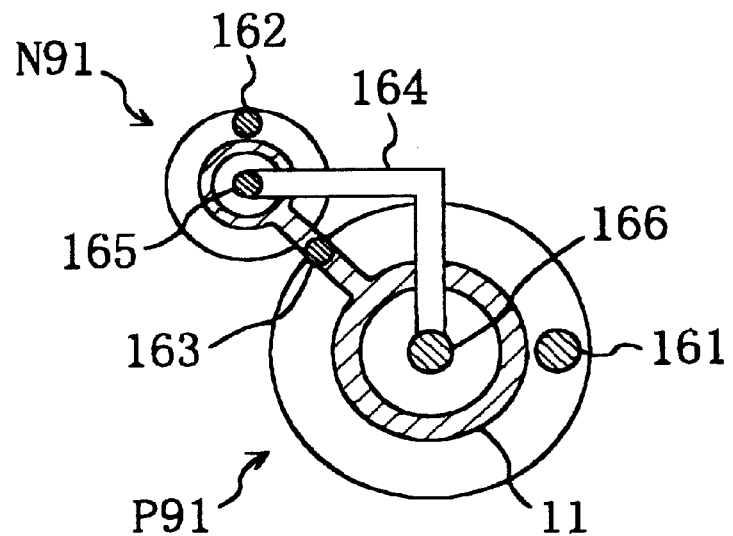
FIG. 19 is a plane view of a mask layout of an inverter-type logic cell constructed of a combination of basic cells according to the fifth embodiment of the present invention.
Figure 20:
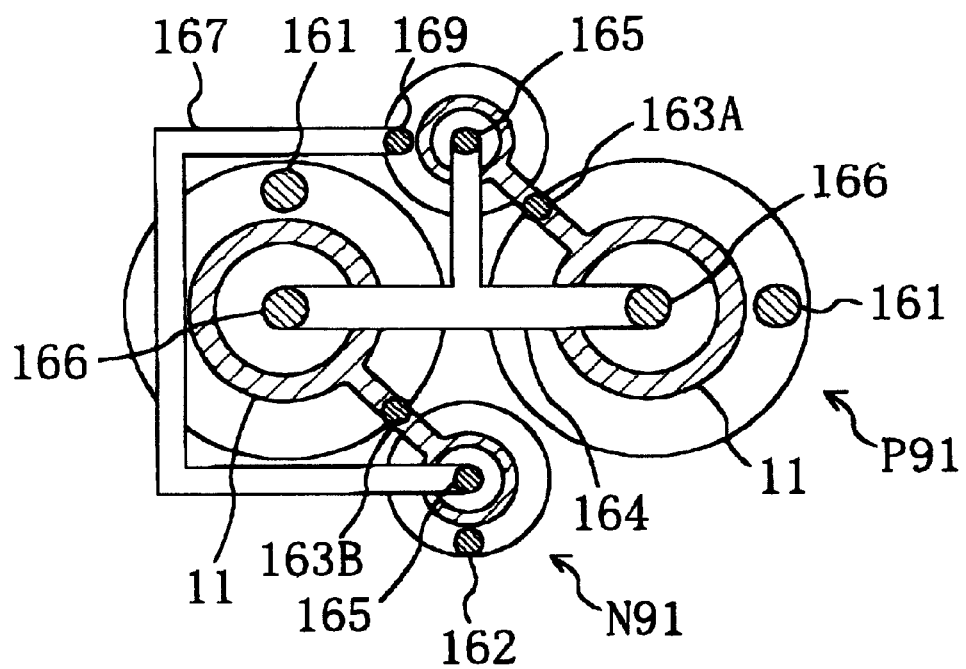
FIG. 20 is a plane view of a mask layout of a NAND-type logic cell constructed of a combination of basic cells according to the fifth embodiment of the present invention.
Figure 21:
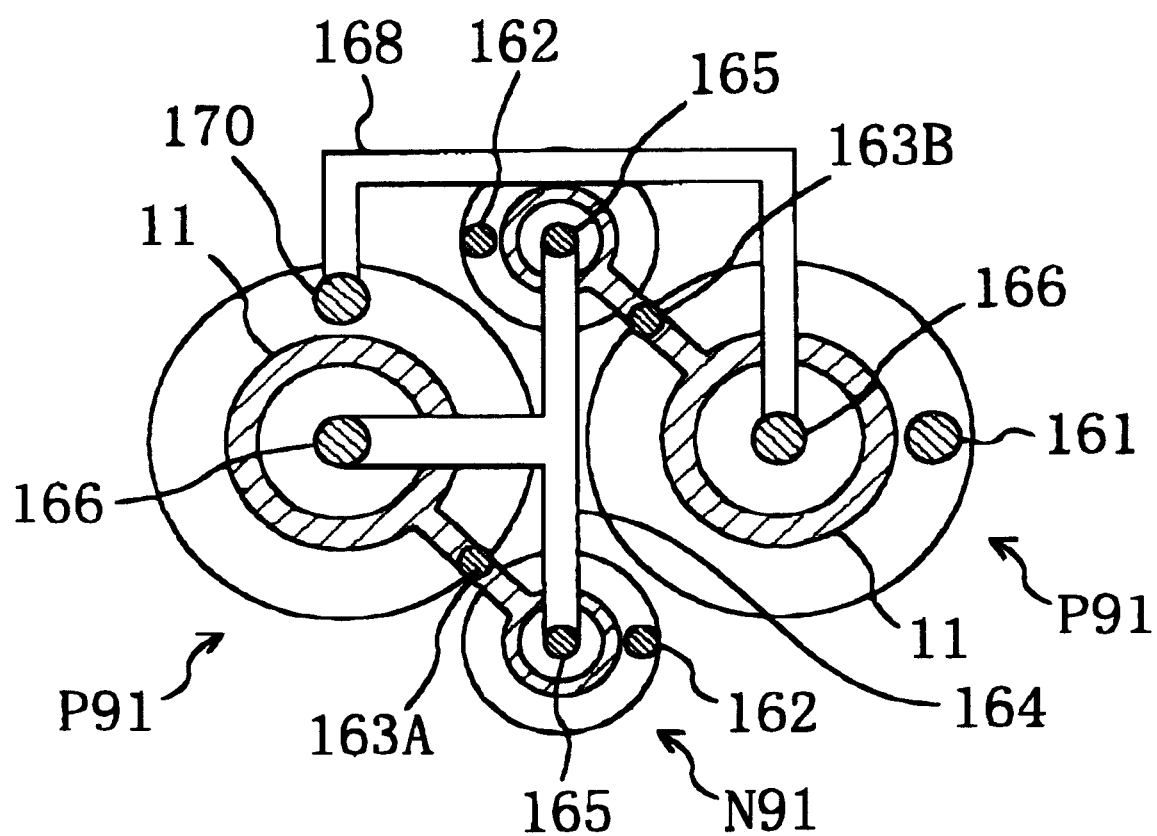
FIG. 21 is a plane view of a mask layout of a NOR-type logic cell constructed of a combination of basic cells according to the fifth embodiment of the present invention.

FIGS. 19 through 21 depict planar structures of mask layouts including components necessary for forming a basic logic circuit such as a metal layer, a polysilicon layer, and a contact that is used to provide connection between the polysilicon layer and the metal layer. Only components necessary for forming the logic circuit are diagramed here.

FIG. 19 is an illustration of an inverter-type logic cell made up of one n-type basic cell 401 and one p-type basic cell 402 shown in FIG. 17. Referring to FIG. 19, each transistor gate region is denoted by reference numeral 11. Element 161 is a contact that is used to provide connection between the source diffusion region of the p-channel transistor P91 and a power line. Element 162 is a contact that is used to provide connection between the source diffusion region of the n-channel transistor N91 and a ground line. Element 163 is an input terminal of the inverter circuit, serving also as a contact that is used to provide connection between a signal line and the gate region 11. Element 164 is a signal line formed of a metal layer that is used to provide connection between the drain diffusion region of the n-channel transistor N91 and the drain diffusion region of the p-channel transistor P91, serving also as an output line of the inverter circuit. Element 165 is a contact that is used to provide connection between the signal line 164 and the drain diffusion region of the n-channel transistor N91. Element 166 is a contact that is used to provide connection between the signal line 164 and the drain diffusion region of the p-channel transistor P91.

Referring now to FIG. 20, therein shown is a NAND-type logic cell that is made up of two n-type basic cells 401 and two p-type basic cells 402 shown in FIG. 17. In FIGS. 19 and 20, the same reference numerals have been applied to like structural elements, and the already-described elements are not discussed here. Element 167 is a signal line formed of a metal layer that is used to provide connection between the drain diffusion region of one of the two n-channel transistors N91 and the source diffusion region of the other n-channel transistor N91, wherein the two n-channel transistors N91 are connected together in series. Element 169 is a contact that is used to provide connection between the signal line 167 and the source diffusion region of the n-channel transistor N91. Element 163A is a first input terminal of the NAND circuit, serving also as a contact that is used to provide connection between a signal line and the gate region 11. Element 163B is a second input terminal of the NAND circuit, serving also as a contact that is used to provide connection between a signal line and the gate region 11.

Referring now to FIG. 21, therein shown is a NOR-type logic cell that is made up of two n-type basic cells 401 and two p-type basic cells 402 shown in FIG. 17. In FIGS. 20 and 21, the same reference numerals have been applied to like structural elements, and the already-described elements are not discussed here. Element 168 is a signal line formed of a metal layer that is used to provide connection between the drain diffusion region of one of the two p-channel transistors P91 and the source diffusion region of the other p-channel region P91, wherein the two p-channel transistors P91 are connected together in series. Element 170 is a contact that is used to provide connection between the signal line 168 and the source diffusion region of the p-channel transistor P91.

FIG. 22 depicts in plane a portion of a SIC device after an LSI fabrication step in which the FIG. 5 logic circuits produced from the FIGS. 19–21 logic cell mask layouts are shown. In FIGS. 19–22, the same reference numerals have been applied to like structural elements, and the already-described elements are not discussed here. Element 151A is an inverter circuit. Element 152A is a NOR circuit. 153A is a NAND circuit. 154 is a signal line formed of a metal layer that is used to provide connection between an output terminal of the inverter circuit 151A and a first input terminal 163A of the NAND circuit 153A. Element 155 is a signal line formed of a metal layer that is used to provide connection between an output terminal of the NOR circuit 152A and a second input terminal 163B of the NAND circuit 153A. The logic circuit has input terminals 156C, 156D, and 156E and an output terminal 157.

The n-type basic cells 401 and the p-type basic cells 402 are constructed of combinations of circular figures, therefore having no vertexes. Additionally, these basic cells are regularly arranged in a matrix of rows and columns and the figures are separated from one another at regular intervals. As previously mentioned, light refraction or light interference in lithography processing and "rounding" in etching processing of the LSI fabrication are most likely to occur in relatively acute-angled figures, and such occurrence depends upon the interval between figures as well as upon the form of figures. As can be seen by comparing the figures of the transistors in the FIG. 18 SIC device after LSI fabrication and their corresponding figures in the FIG. 17 mask layout, the former transistor figures each have a slightly narrow gate region. However, the effect of difference with mask layouts in miniaturization-advanced LSI fabrication can be held low, and the n-type basic cells 401 and the p-type basic cells 402 are regularly arranged in a matrix of rows and columns. This then makes it possible to compute, within a realistic period of time, effects occurring, during the LSI fabrication, in transistors overlying a substrate such as "rounding", either by extracting a submatrix of several basic cells×several basic cells and experimentally fabricating the extracted basic cells in an LSI fabrication step or by performing the simulation of a photolithography process. Additionally, since the basic cells 401 are arranged with a shift of half of the pitch for every one line with respect to the basic cells 402, the cells 401 and 402 are placed in closest packing fashion in 2D. As a result, further higher-level integration can be realized.

In the placement of the n-channel and p-channel transistors N91 and P91, transistors of the same type are arranged in the row direction. Neither the p-well formation regions Pw nor the n-well formation regions Nw are cut off at every transistor. Both the regions Pw and Nw are continuously arranged in rows. This achieves a suitably reduction of the number of substrate contacts, and the provision of intervals for separating the p- and n-well formation regions Pw and Nw from one another is required only in the column direction, thereby further improving on the level of integration.

The diameter of the gate region P91g of the p-channel transistor P91 is greater than that of the gate region N91g of the n-channel transistor N91 and the gate width of the p-channel transistor P91 is therefore greater than that of the n-channel transistor N91. Accordingly, even when the p-channel transistor P91 is inferior in electric characteristic such as the value of saturation current per unit gate width to the n-channel transistor N91, the balance in electric characteristic between the p-channel transistor P91 and the n-channel transistor N91 can be achieved by adjusting the p-channel transistor P91 in size as well as in gate width according to the characteristic of an LSI fabrication step employed.

Further, each transistor is provided with an annularly-formed gate region, which produces the advantage that higher-level integration can be accomplished because the present invention eliminates the need for allowing a margin for coping with the tapering of gate electrode ends. Such a margin must be taken into consideration in conventional linear gate electrode mask patterns.

The FIG. 22 logic circuit is just an example. A target logic circuit may be constructed by suitably combining the n-type and p-type basic cells 401 and 402 that are regularly arranged with, for example, interconnection lines (metal layers), polysilicon layers, and contacts for establishing connection with overlying layers.

In the present embodiment, the external contour of basic cells in a mask layout is a circle. Instead of using a circle as basic cell external contour, any other polygonal forms including a pentagon and more sided polygons may be employed with the same advantages as obtained in the present embodiment.

The present embodiment shows a mask layout for an underlying layer in a SIC device according to the gate array architecture. Such a mask layout may be one for an underlying layer in a SIC device according to the standard cell architecture.

What is claimed is:

1. A semiconductor integrated circuit device comprising:
   (a) a logic circuit section that is formed on a surface of a semiconductor substrate;
   (b) a plurality of basic cells that are formed in said logic circuit section;
   wherein:
       each of said basic cells includes at least one transistor pair arrangement composed of an n-channel transistor and a p-channel transistor, said n-channel and p-channel transistors having gate regions that are electrically connected together;
       each of said basic cells is formed in an element formation surface in parallel with said semiconductor substrate surface, defining, as an external contour thereof, at least one of a group consisting of a polygonal shape having six sides or more and a circular shape.

2. The semiconductor integrated circuit device of claim 1, wherein, in each of said basic cells, said p-channel transistor has a gate width greater than that of said n-channel transistor.

3. The semiconductor integrated circuit device of claim 1, wherein, in each of said basic cells, a sum of a source region, a drain region and the gate region of said p-channel transistor is larger than that of said n-channel transistor at said element formation surface.

4. The semiconductor integrated circuit device of claim 1, wherein:
   (a) both said gate regions of said n-channel and p-channel transistors are annularly formed in said element formation surface;
   (b) said n-channel transistor includes:
       a first source/drain diffusion region that is formed inside said annularly-formed gate region of said n-channel transistor, said first source/drain diffusion region defining a sectoral shape having a vertex at the center of said annularly-formed gate region of said n-channel transistor;
       a second source/drain diffusion region that is formed outside said annularly-formed gate region of said n-channel transistor, said second source/drain diffusion region defining a shape having two opposing sides that lie on the prolongation of the two radii of said sectoral first source/drain diffusion region; and (c) said p-channel transistor includes:
       a third source/drain diffusion region that is formed inside said annularly-formed gate region of said p-channel transistor, said third source/drain diffusion region defining a sectoral shape having a vertex at the center of said annularly-formed gate region of said p-channel transistor without overlapping said first source/drain diffusion region of said n-channel transistor;
       a fourth source/drain diffusion region that is formed outside said annularly-formed gate region of said p-channel transistor, said fourth source/drain diffusion region defining a shape having two opposing sides that lie on the prolongation of the two radii of said sectoral third source/drain diffusion region.

5. The semiconductor integrated circuit device of claim 4, wherein said third and fourth source/drain diffusion regions of said p-channel transistor are larger in size than said first and second source/drain diffusion regions of said n-channel transistor.

6. The semiconductor integrated circuit device of claim 1,
   (a) said gate regions being formed of a first gate electrode portion for said n-channel transistor that is annularly formed in said element formation surface and a second gate electrode portion for said p-channel transistor that is formed in such a way as to enclose the outside of said annularly-formed first gate electrode portion, respectively;
   (b) said n-channel transistor including:
       a first source/drain diffusion region that is formed inside said annularly-formed first gate electrode portion;
       a second source/drain diffusion region that is formed outside and along said annularly-formed first electrode portion;
   (c) said p-channel transistor including:
       a third source/drain diffusion region that is formed inside and along said second gate electrode portion without overlapping said second source/drain diffusion region of said n-channel transistor;
       a fourth source/drain diffusion region that is formed outside and along said second gate electrode portion.

7. The semiconductor integrated circuit device of claim 1, wherein said basic cells are arranged at predetermined intervals in a matrix of columns and rows.

8. The semiconductor integrated circuit device of claim 7, wherein basic cells of said basic cells that belong in one row are shifted rowwise by half of said predetermined interval with respect to basic cells that belong in a row adjacent to said one row.

9. A semiconductor integrated circuit device comprising a logic circuit section that is formed on a surface of a semiconductor substrate,
   said logic circuit section having:
   (a) a plurality of n-type basic cells which each include an n-channel transistor, said n-channel transistor comprising:
       (a-1) a gate region that is annularly formed in an element formation surface in parallel with said semiconductor substrate surface;
       (a-2) a first source/drain diffusion region that is formed inside said gate region;
       (a-3) a second source/drain diffusion region that is formed outside and along said gate region; and
   (b) a plurality of p-type basic cells which each have a p-channel transistor, said p-channel transistor comprising:

(b-1) a gate region that is annularly formed in said element formation surface;

(b-2) a first source/drain diffusion region that is formed inside said gate region;

(b-3) a second source/drain diffusion region that is formed outside and along said gate region;

wherein said second source/drain diffusion regions of said n-channel and p-channel transistors each have, at said element formation surface, an external contour in a shape of at least one of a group consisting of a polygon having six sides or more and a circle.

10. The semiconductor integrated circuit device of claim 9, wherein said n-type and p-type basic cells have the same external contour and the same size, said external contour being at least one of a group consisting of a rectangle, a hexagon and a circle.

11. The semiconductor integrated circuit device of claim 9, wherein said logic circuit section has a logic unit made up of at least one said n-type basic cell and at least one said p-type basic cell and wherein said n-type and p-type basic cells of said logic unit are located next to each other and have respective gate regions that are electrically connected together.

12. The semiconductor integrated circuit device of claim 9, wherein said n-type and p-type basic cells are arranged by type at predetermined intervals in a matrix of rows and columns in order that basic cells of the same type are arranged in the row direction or in the column direction.

13. The semiconductor integrated circuit device of claim 12, wherein basic cells of said basic cells that belong in one row are shifted rowwise by half of said predetermined interval with respect to basic cells that belong in a row adjacent to said one row.

14. The semiconductor integrated circuit device of claim 9, wherein said p-channel transistor of said p-type basic cell has a gate width greater than that of said n-channel transistor of said n-type basic cell and wherein said p-type basic cell has, at said element formation surface, an external contour larger in size than that of said n-type basic cell.

\* \* \* \* \*